(12) United States Patent
Lee et al.

(10) Patent No.: US 12,425,050 B2
(45) Date of Patent: Sep. 23, 2025

(54) METHOD AND APPARATUS FOR ENCODING AND DECODING SIGNAL IN WIRELESS COMMUNICATION SYSTEM, AND SYSTEM FOR PROVIDING SAME

(71) Applicants: Samsung Electronics Co., Ltd., Suwon-si (KR); RESEARCH & BUSINESS FOUNDATION SUNGKYUNKWAN UNIVERSITY, Suwon-si (KR)

(72) Inventors: Kwonjong Lee, Suwon-si (KR); Juho Lee, Suwon-si (KR); Sanghyo Kim, Suwon-si (KR); Seunghyun Lee, Suwon-si (KR); Minyoung Chung, Suwon-si (KR); Hyosang Ju, Suwon-si (KR); Jisang Park, Suwon-si (KR)

(73) Assignees: Samsung Electronics Co., Ltd., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 18/563,160

(22) PCT Filed: May 24, 2022

(86) PCT No.: PCT/KR2022/007352
§ 371 (c)(1),
(2) Date: Nov. 21, 2023

(87) PCT Pub. No.: WO2022/250417
PCT Pub. Date: Dec. 1, 2022

(65) Prior Publication Data
US 2024/0267057 A1    Aug. 8, 2024

(30) Foreign Application Priority Data
May 24, 2021   (KR) ........................ 10-2021-0066202

(51) Int. Cl.
*H03M 13/13* (2006.01)
*H03M 13/09* (2006.01)
(Continued)

(52) U.S. Cl.
CPC ........... *H03M 13/13* (2013.01); *H03M 13/09* (2013.01); *H03M 13/2906* (2013.01); *H03M 13/45* (2013.01)

(58) Field of Classification Search
CPC .. H03M 13/13; H03M 13/09; H03M 13/2906; H03M 13/45
See application file for complete search history.

(56) References Cited

U.S. PATENT DOCUMENTS

| 8,458,549 | B2 | 6/2013 | Furusawa et al. |
| 9,287,896 | B2 | 3/2016 | Seo et al. |

(Continued)

FOREIGN PATENT DOCUMENTS

| JP | 2012-120217 A | 6/2012 |
| KR | 10-2009-0026238 A | 3/2009 |

(Continued)

OTHER PUBLICATIONS

K. Niu and K. Chen, CRC-aided Decoding of Polar Codes, in IEEE Commun. Lett., vol. 16, No. 10, pp. 1668-1671, Oct. 2012, Sep. 7, 2012.

(Continued)

*Primary Examiner* — Robert W Beausoliel, Jr.
(74) *Attorney, Agent, or Firm* — Jefferson IP Law, LLP

(57) ABSTRACT

The present disclosure relates to a 5G or 6G communication system for supporting a higher data transmission rate. An encoding method using a polar code in a wireless communication system, according to an embodiment of the present disclosure, may comprise: generating first cyclic redundancy check (CRC) bits for a plurality of information bits to be (Continued)

| i | $W_{32}^{(i)}$ | $R_{32}^{(i)}$ | |
|---|---|---|---|
| K | Bit-Index | Weight | Reliability | |
| 1 | 31 | 32 | 7.3 | More reliable |
| 2 | 30 | 16 | 6.3 | |
| 3 | 29 | 16 | 6.1 | |
| 4 | 27 | 16 | 5.9 | |
| 5 | 23 | 16 | 5.6 | |
| 6 | 15 | 16 | 5.3 | |
| 7 | 28 | 8 | 5.1 | |
| 8 | 26 | 8 | 4.9 | |
| 9 | 25 | 8 | 4.7 | Descending order of reliability{$S_q$} |
| 10 | 22 | 8 | 4.6 | |
| 11 | 21 | 8 | 4.4 | |
| 12 | 14 | 8 | 4.3 | |
| 13 | 19 | 8 | 4.2 | |
| 14 | 13 | 8 | 4.1 | |
| 15 | 11 | 8 | 3.9 | |
| 16 | 24 | 4 | 3.7 | Unreliable |

901  902 transmitted, by the number of second bits that is less than the number of first bits determined so as to add a CRC code with respect to the plurality of information bits; for vulnerable bits from among the plurality of information bits to be transmitted, generating second CRC bits as many as bits corresponding to a difference between the number of first bits and the number of second bits; generating first encoded bits in which the information bits, the first CRC bits, and the second CRC bits are concatenated; and polar-encoding the first encoded bits.

10 Claims, 33 Drawing Sheets

(51) Int. Cl.
  *H03M 13/29* (2006.01)
  *H03M 13/45* (2006.01)

(56) References Cited

U.S. PATENT DOCUMENTS

| | | | |
|---|---|---|---|
| 9,525,513 | B2 | 12/2016 | Pi et al. |
| 10,142,060 | B2* | 11/2018 | Xu ................... H04L 1/0045 |
| 2017/0214416 | A1* | 7/2017 | Ge ................... H03M 13/13 |
| 2018/0287738 | A1* | 10/2018 | Xu ................... H04L 1/0064 |
| 2020/0076535 | A1 | 3/2020 | Xu et al. |
| 2022/0393791 | A1 | 12/2022 | Lee et al. |

FOREIGN PATENT DOCUMENTS

| | | |
|---|---|---|
| KR | 10-2010-0063032 A | 6/2010 |
| KR | 10-2019-0093582 A | 8/2019 |
| KR | 10-2022-0157146 A | 11/2022 |

OTHER PUBLICATIONS

[Guo15] J. Guo et al., Multi-CRC Polar Codes and Their Applications, in IEEE Commun. Lett., vol. 20, issue: 2, pp. 212-215, Feb. 2016, Dec. 11, 2015.
[Kim17] J. Kim, S. Kim, J. Jang, Y. Kim, Low Complexity List Decoding for Polar Codes with Multiple CRC Codes, in MDPI Entropy, vol. 19, issue: 4, Feb. 2017, Apr. 24, 2017.
Z. Qingshaung, L. Aijun, P. Xiaofei, Efficient CRC Concatenation Scheme for Polar Codes, in IEEE Elec. Lett., vol. 53, issue: 13, Jun. 2017, Jun. 1, 2017.
[Mori09] R. Mori and T. Tanaka, Performance of polar codes with the construction using density evolution, in IEEE Commun. Lett., vol. 13, No. 7, pp. 519-521, Jul. 2009, Jul. 21, 2009.
[Trifonov12] P. Trifonov, Efficient design and decoding of polar codes, in IEEE Trans. Commun., vol. 60, No. 11, pp. 3221-3227, Nov. 2012, Aug. 22, 2012.
[He17] G. He et al., β-expansion: A theoretical framework for fast and recursive construction of polar codes, in Proc. IEEE Globecom, Singapore, Dec. 2017, Jan. 15, 2018.
International Search Report dated Aug. 31, 2022, issued in International Application No. PCT/KR2022/007352.

* cited by examiner

FIG. 6

| K | Bit-Index $i$ | Weight $W_{32}^{(i)}$ | Reliability $R_{32}^{(i)}$ | |
|---|---|---|---|---|
| 1 | 31 | 32 | 7.3 | More reliable |
| 2 | 30 | 16 | 6.3 | |
| 3 | 29 | 16 | 6.1 | |
| 4 | 27 | 16 | 5.9 | |
| 5 | 23 | 16 | 5.6 | |
| 6 | 15 | 16 | 5.3 | |
| 7 | 28 | 8 | 5.1 | |
| 8 | 26 | 8 | 4.9 | |
| 9 | 25 | 8 | 4.7 | Descending order of reliability($S_N$) |
| 10 | 22 | 8 | 4.6 | |
| 11 | 21 | 8 | 4.4 | |
| 12 | 14 | 8 | 4.3 | |
| 13 | 19 | 8 | 4.2 | |
| 14 | 13 | 8 | 4.1 | |
| 15 | 11 | 8 | 3.9 | |
| 16 | 24 | 4 | 3.7 | |
| 17 | 7 | 8 | 3.6 | |
| 18 | 20 | 4 | 3.4 | Unreliable |

Profile of more reliable 18 (=k+$n_{CRC}$) bits

FIG. 9

| K | Bit-Index | Weight | Reliability | |
|---|---|---|---|---|
| | $i$ | $W_{32}^{(i)}$ | $R_{32}^{(i)}$ | |
| 1 | 31 | 32 | 7.3 | More reliable |
| 2 | 30 | 16 | 6.3 | |
| 3 | 29 | 16 | 6.1 | |
| 4 | 27 | 16 | 5.9 | |
| 5 | 23 | 16 | 5.6 | |
| 6 | 15 | 16 | 5.3 | |
| 7 | 28 | 8 | 5.1 | |
| 8 | 26 | 8 | 4.9 | |
| 9 | 25 | 8 | 4.7 | Descending order of reliability($S_N$) |
| 10 | 22 | 8 | 4.6 | |
| 11 | 21 | 8 | 4.4 | |
| 12 | 14 | 8 | 4.3 | |
| 13 | 19 | 8 | 4.2 | |
| 14 | 13 | 8 | 4.1 | |
| 15 | 11 | 8 | 3.9 | |
| 16 | 24 | 4 | 3.7 | Unreliable |

| K | Bit-Index | Weight | Reliability |
|---|---|---|---|
| 1 | 31 | 32 | 7.3 |
| 2 | 30 | 16 | 6.3 |
| 3 | 29 | 16 | 6.1 |
| 4 | 27 | 16 | 5.9 |
| 5 | 23 | 16 | 5.6 |
| 6 | 15 | 16 | 5.3 |
| 7 | 28 | 8 | 5.1 |
| 8 | 26 | 8 | 4.9 |
| 9 | 25 | 8 | 4.7 |
| 10 | 22 | 8 | 4.6 |
| 11 | 21 | 8 | 4.4 |
| 12 | 14 | 8 | 4.3 |
| 13 | 19 | 8 | 4.2 |
| 14 | 13 | 8 | 4.1 |
| 15 | 11 | 8 | 3.9 |
| 16 | 24 | 4 | 3.7 |
| 17 | 7 | 8 | 3.6 |
| 18 | 20 | 4 | 3.4 |
| 19 | 18 | 4 | 3.2 |
| 20 | 12 | 4 | 3.1 |
| 21 | 17 | 4 | 3.0 |
| 22 | 10 | 4 | 2.9 |

More reliable

Descending order of reliability($S_N$)

Unreliable

METHOD AND APPARATUS FOR ENCODING AND DECODING SIGNAL IN WIRELESS COMMUNICATION SYSTEM, AND SYSTEM FOR PROVIDING SAME

TECHNICAL FIELD

The disclosure relates to a method for encoding and decoding signals in a wireless communication system, and a system for providing the same.

BACKGROUND ART

5th generation (5G) mobile communication technologies define broad frequency bands such that high transmission rates and new services are possible, and can be implemented not only in "Sub 6 GHz" bands such as 3.5 GHz, but also in "Above 6 GHz" bands referred to as mmWave including 28 GHz and 39 GHz. In addition, it has been considered to implement 6th generation (6G) mobile communication technologies (referred to as Beyond 5G systems) in terahertz bands (e.g., 95 GHz to 3 THz bands) in order to accomplish transmission rates fifty times faster than 5G mobile communication technologies and ultra-low latencies one-tenth of 5G mobile communication technologies.

At the beginning of the development of 5G mobile communication technologies, in order to support services and to satisfy performance requirements in connection with enhanced mobile broadband (eMBB), ultra-reliable low latency communications (URLLC), and massive machine-type communications (mMTC), there has been ongoing standardization regarding beamforming and massive multi input multi output (MIMO) for mitigating radio-wave path loss and increasing radio-wave transmission distances in mmWave, supporting numerologies (e.g., operating multiple subcarrier spacings) for efficiently utilizing mmWave resources and dynamic operation of slot formats, initial access technologies for supporting multi-beam transmission and broadbands, definition and operation of bandwidth part (BWP), new channel coding methods such as a low density parity check (LDPC) code for large amount of data transmission and a polar code for highly reliable transmission of control information, L2 pre-processing, and network slicing for providing a dedicated network specialized to a specific service.

Currently, there are ongoing discussions regarding improvement and performance enhancement of initial 5G mobile communication technologies in view of services to be supported by 5G mobile communication technologies, and there has been physical layer standardization regarding technologies such as vehicle-to-everything (V2X) for aiding driving determination by autonomous vehicles based on information regarding positions and states of vehicles transmitted by the vehicles and for enhancing user convenience, new radio unlicensed (NR-U) aimed at system operations conforming to various regulation-related requirements in unlicensed bands, NR UE power saving, non-terrestrial network (NTN) which is UE-satellite direct communication for providing coverage in an area in which communication with terrestrial networks is unavailable, and positioning.

Moreover, there has been ongoing standardization in air interface architecture/protocol regarding technologies such as industrial internet of things (IIoT) for supporting new services through interworking and convergence with other industries, integrated access and backhaul (IAB) for providing a node for network service area expansion by supporting a wireless backhaul link and an access link in an integrated manner, mobility enhancement including conditional handover and dual active protocol stack (DAPS) handover, and two-step random access for simplifying random access procedures (2-step RACH for NR). There also has been ongoing standardization in system architecture/service regarding a 5G baseline architecture (e.g., service based architecture or service based interface) for combining Network Functions Virtualization (NFV) and Software-Defined Networking (SDN) technologies, and Mobile Edge Computing (MEC) for receiving services based on UE positions.

As 5G mobile communication systems are commercialized, connected devices that have been exponentially increasing will be connected to communication networks, and it is accordingly expected that enhanced functions and performances of 5G mobile communication systems and integrated operations of connected devices will be necessary. To this end, new research is scheduled in connection with extended Reality (XR) for efficiently supporting Augmented Reality (AR), Virtual Reality (VR), Mixed Reality (MR) and the like, 5G performance improvement and complexity reduction by utilizing Artificial Intelligence (AI) and Machine Learning (ML), AI service support, metaverse service support, and drone communication.

Furthermore, such development of 5G mobile communication systems will serve as a basis for developing not only new waveforms for providing coverage in terahertz bands of 6G mobile communication technologies, multi-antenna transmission technologies such as Full Dimensional MIMO (FD-MIMO), array antennas and large-scale antennas, meta-material-based lenses and antennas for improving coverage of terahertz band signals, high-dimensional space multiplexing technology using Orbital Angular Momentum (OAM), and Reconfigurable Intelligent Surface (RIS), but also full-duplex technology for increasing frequency efficiency of 6G mobile communication technologies and improving system networks, AI-based communication technology for implementing system optimization by utilizing satellites and AI from the design stage and internalizing end-to-end AI support functions, and next-generation distributed computing technology for implementing services at levels of complexity exceeding the limit of UE operation capability by utilizing ultra-high-performance communication and computing resources.

Channel coding is a technology for enabling messages to be transmitted with high reliability by using parity bits during data transmission. For this purpose, the use of error correction codes is essential. Shannon defined the maximum amount of information transmission that allows reliable communication as 'channel capacity'. Since then, numerous studies have been conducted on error correction codes to approach Shannon's channel capacity. Starting with classical codes such as Hamming, Bose-Chaudhuri-Hocquenghem (BCH), and Reed-Solomon (RS) codes, a variety of modern codes such as low-density parity check (LDPC) code, turbo code, and polar code have been newly proposed. In particular, the LDPC code is known as a representative channel capacity-approaching code.

Among them, the polar codes are error correction codes first proposed by Arikan in 2009 and the first codes that have been theoretically proven to achieve channel capacity as the code length increases in various types of binary input memoryless channels. The decoding performance of polar codes based on successive cancellation (SC) decoding was inferior to that of LDPC codes or turbo codes in the practical length region, but it was greatly improved through later discovered successive cancellation list (SC-List, SCL) decoding and related algorithms. In particular, through the standardization process in the 3rd Generation Partnership Project (3GPP) 5G New Radio (NR), the polar codes have been further improved in error correction and detection capabilities in the middle and final stages of decoding by utilizing cyclic redundancy check (CRC) codes and parity check (PC) codes, so they have been adopted as an error correction code for the enhanced mobile broadband (eMBB) control channel and are also being considered as channel code candidates for the ultra-reliable low-latency communications (URLLC) scenarios.

Maximum-likelihood (ML) or ML-like decoding performance of the channel code is closely related to the minimum distance of the code. In detail, the larger the minimum distance of a code or the smaller the number of codewords with minimum weight, the better the decoding performance.

Thus, using the CRC codes can improve the distance spectrum of the existing polar codes (full protection), or selectively protecting only some crucial information bits (CIB) while using the CRC codes can enhance the detection efficiency of the CRC codes. This scheme of increasing the detection efficiency of the CRC codes is called a partial protection technique. However, when applying the partial protection techniques known to date, there may be many areas where performance is greatly reduced compared to the full protection technique, depending on the composition of the information set. Therefore, there is a need for a method and apparatus that can enhance the detection efficiency through an improved CRC concatenation algorithm and thereby enhance the decoding performance of polar codes.

DISCLOSURE OF INVENTION

Technical Problem

Accordingly, the disclosure provides a method and apparatus that can enhance the polar code decoding performance in a system using a CRC concatenation algorithm.

Additionally, the disclosure provides a method and apparatus that can improve the polar code decoding performance when using a CRC concatenation algorithm in a wireless communication system.

Further, the disclosure provides a method and apparatus for a CRC partial protection with a low error-floor when using a CRC concatenation algorithm.

Solution to Problem

According to an embodiment of the disclosure, an encoding method using polar codes in a wireless communication system may include generating first CRC bits for a plurality of information bits with a second bit number smaller than a first bit number determined to add a cyclic redundancy check (CRC) code to the plurality of information bits to be transmitted; generating second CRC bits with bits equal to a difference between the first bit number and the second bit number for weak bits among the plurality of information bits to be transmitted; generating first encoded bits by concatenating the information bits, the first CRC bits, and the second CRC bits; and performing polar-encoding on the first encoded bits.

According to an embodiment of the disclosure, an encoding apparatus includes a memory; a transceiver; and a processor configured to:
generate first CRC bits for a plurality of information bits with a second bit number smaller than a first bit number determined to add a cyclic redundancy check (CRC) code to the plurality of information bits to be transmitted, generate second CRC bits with bits equal to a difference between the first bit number and the second bit number for weak bits among the plurality of information bits to be transmitted, generate first encoded bits by concatenating the information bits, the first CRC bits, and the second CRC bits, and perform polar-encoding on the first encoded bits.

According to another embodiment of the disclosure, a method for performing data communication using polar codes in a receiving apparatus of a wireless communication system may include receiving an inquiry about applying a cyclic redundancy check (CRC) code concatenated polar code based on partial protection from a transmitting apparatus; selecting a parity bit for a CRC polar code in response to the received inquiry; and transmitting a response about applying the CRC concatenated polar code based on partial protection to the transmitting apparatus.

Selecting the parity bit for the CRC polar code may include:
identifying code parameters for a length (N) of a code to be transmitted, the number of information bits (k), and the number of weak bits; and determining a protection area set to be protected by the CRC based on the identification.

According to another embodiment of the disclosure, a receiving apparatus for performing data communication using polar codes in a wireless communication system includes a memory; a transceiver; and a processor configured to:
receive an inquiry about applying a cyclic redundancy check (CRC) code concatenated polar code based on partial protection from a transmitting apparatus, select a parity bit for a CRC polar code in response to the received inquiry, and transmit a response about applying the CRC concatenated polar code based on partial protection to the transmitting apparatus.

The processor may:
when selecting the parity bit for the CRC polar code, identify code parameters for a length (N) of a code to be transmitted, the number of information bits (k), and the number of weak bits, and determine a protection area set to be protected by the CRC based on the identification.

Advantageous Effects of Invention

According to the disclosure, it is possible to enhance the polar code decoding performance in a system using a CRC concatenation algorithm. Additionally, it is possible to improve the polar code decoding performance, especially when using the CRC concatenation algorithm in a wireless communication system. Further, it is possible to have a low error-floor in the case of using the CRC concatenation algorithm.

BRIEF DESCRIPTION OF DRAWINGS

FIG. 6 is an exemplary table illustrating the qualities of bit channels in descending order of reliability in the case of polar codes with N=32, k=12, and l=6.

FIG. 9 is an exemplary diagram illustrating CRC protection areas in the disclosure and a conventional technique when the number of weak bits in an information set is less than a predetermined threshold value.

FIG. 10 is an exemplary diagram illustrating CRC protection areas in the disclosure and a conventional technique when the number of weak bits in an information set is greater than or equal to a predetermined threshold value.

MODE FOR THE INVENTION

Figure 1A:
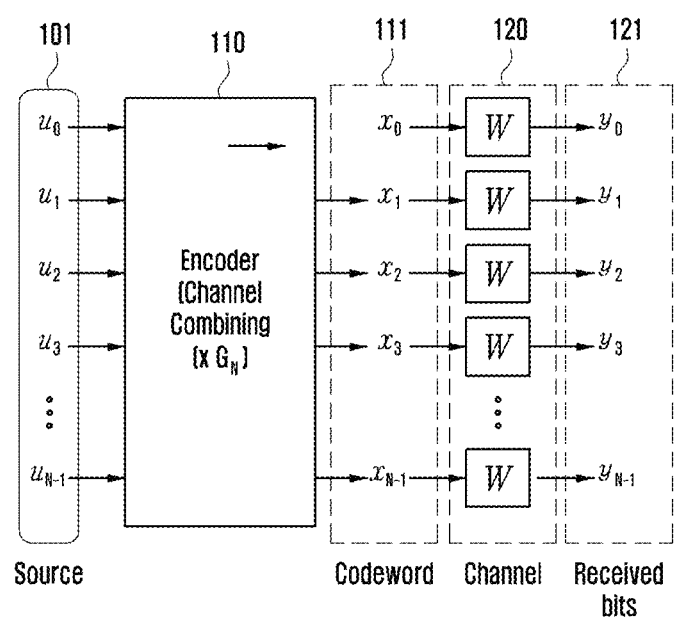
FIGS. 1A and 1B are exemplary diagrams illustrating channel combining and channel splitting processes for polar codes.

Hereinafter, various embodiments of the disclosure will be described in detail with reference to the accompanying drawings. It should be noted that in the accompanying drawings, the same element is indicated by the same reference numeral as much as possible. In addition, detailed descriptions and illustration of well-known functions and elements that may obscure the subject matter of the disclosure will be omitted. This is to more clearly convey the subject matter of the disclosure without obscuring it by omitting unnecessary description and illustration.

At the outset, polar codes according to the disclosure will be described.

The polar codes are error correction codes capable of theoretically achieving a channel capacity, and the codes are designed using 'channel polarization' composed of channel combining and channel splitting.

Figure 1B:
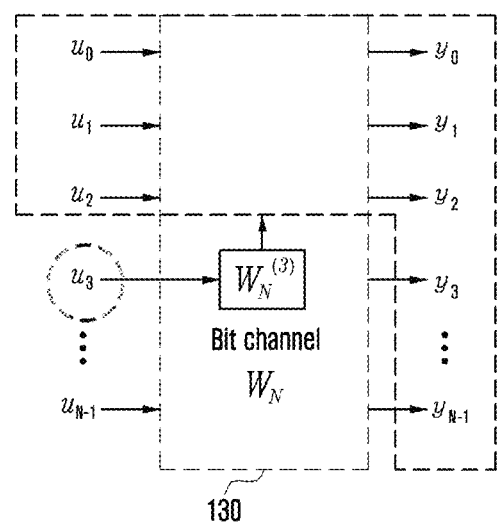

FIGS. 1A and 1B are exemplary diagrams illustrating channel combining and channel splitting processes for polar codes. Specifically, FIG. 1A exemplarily shows channel combining, and FIG. 1B exemplarily shows channel splitting.

First, with reference to FIG. 1A, the channel combining will be described. Assuming that input information is source bits. Then, u bits (ui: i-th source bit) 101, which are source bits, are converted into x bits (xi: i-th codeword bit) 111 through GN, which is a generation matrix of an encoder 110. The generation matrix can be expressed as Equation 1 below.

$$x = uG_N \qquad \text{Equation 1}$$

In Equation 1, it is defined as $$G_N = G_2^{\otimes n}\left(G_2 = \begin{pmatrix} 1 & 0 \\ 1 & 1 \end{pmatrix}, (\cdot)^{\otimes}\right),$$

which generates x bits through the Kronecker product and outputs respective codeword bits (x0, x1, ..., xN−1). In addition, the respective codeword bits experience independently and identically distributed (i.i.d.) channels W 120, and y bits (yi: i-th received signal bit) 121 are provided as received bits. In this case, as shown in FIG. 1B, one large combined channel WN 130 that connects the bits of the u domain and the bits of the y domain can be obtained, which is called the channel combining.

Next, referring to FIG. 1B, the channel splitting refers to the process of obtaining virtual bit channels $W_N^{(i)}$ (i∈ {0,1, ..., N−1} experienced by the respective u bits from the combined channel WN 130. In the case of polar codes, the respective source (u) bits are sequentially decoded one bit at a time, and the channels experienced by each u bit are defined and the quality is evaluated under the assumption that the previously decoded results ($u_0^{i-1}=(u_0,u_1,\ldots,u_{i-1})$) have been decoded correctly. In this case, a virtual splitting channel with the i-th source bit (ui) as the input and $u_0^{i-1}=(u_0,u_1,\ldots,u_{i-1})$ and $y_0^{N-1}=(y_0,y_1,\ldots,y_{N-1})$ as the output is assumed. In an example shown in FIG. 1B, u3 experiences a bit channel $W_N^{(3)}$ where the input is $u3(\in (0, 1))$ and the output is $u_0^2, y_0^3$.

As a result, through the channel combining and splitting, N bit channels $W_N^{(i)}(i \in \{0,1,\ldots,N-1\}$ having different qualities can be obtained from N i.i.d. channels W having the same quality. The capacities of these split bit channels are consequently polarized. This polarization phenomenon can be confirmed by calculating the capacities or error rates of bit channels. In order to approximate and evaluate the qualities of N bit channels, a density evolution method (R. Mori and T. Tanaka, "Performance of polar codes with the construction using density evolution" in IEEE Commun. Lett., vol. 13, no. 7, pp. 519-521, July 2009) (hereinafter referred to as [Mori09]), a Gaussian approximation method (P. Trifonov, "Efficient design and decoding of polar codes" in IEEE Trans. Commun., vol. 60, no. 11, pp. 3221-3227, November 2012) (hereinafter referred to as [Trifonov12]), and a polarization weight method (G. He et al., "β-expansion: A theoretical framework for fast and recursive construction of polar codes" in Proc. IEEE GLOBECOM, Singapore, December 2017) (hereinafter referred to as [He17]) have been proposed. In the disclosure, among the above methods, a bit channel quality evaluation method based on the polarization weight is considered.

The polarization weight (or polarization reliability) method expresses the quality of each bit channel based on a weighted sum. The quality of a bit channel whose index (i.e., decimal index) is i for a code length N (=2n) is expressed by a metric as in Equation 2 below.

$$PW_N^{(i)} \sum_{j=0}^{n-1} b_j (2^{1/4})^j \qquad \text{Equation 2}$$

In Equation 2, $bj(j \in \{n01,\ldots,1,0\})$ refers to a bit value within the binary expression $i=(bn-1bn-2,\ldots,b1b0)2$ of an index $i(\in \{0,1,\ldots,N-1\})$. Here, b0 is the least significant bit (LSB) and bn−1 is the most significant bit (MSB). For example, if N is 8, the qualities of all 8 bit channels are $PW_8^{(0)}=0, PW_S^{(1)}=1, PW_S^{(2)}=1.189, PW_8^{(3)}=2.189, PW_8^{(4)}=1.414, PW_S^{(5)}=2.414, PW_S^{(6)}=2.603, PW_S^{(7)}=3.603$, and the larger the value, the higher the reliability. In the polarization reliability evaluation method, the quality of bit channels is calculated as a simple weighted sum regardless of a channel type and code parameters (e.g., N, k). Unlike the density evolution or Gaussian approximation methods that adaptively perform code design according to channel code parameters, the polarization reliability method can support (rate-compatible) multiple code rates with a single sequence.

However, because a 2×2 polarization kernel matrix is considered when designing the existing polar codes, the code length is limited to 2n (n=1, 2, ... ). In order to apply the polar codes to actual applications, an arbitrary code-length needs to be supported. Thus, various methods such as rate-matching puncturing/shortening/repetition are applied.

The puncturing is a method of removing J bits from the x domain so that the codeword bits become M (=N−J), and the punctured J bits are not transmitted. Since the decoder does not have any information about the punctured bits, the log-likelihood ratio (LLR) corresponding to such bits is set to 0. The shortening is a method of selecting J bits to be shortened in the u domain and fixing the values of these bits to 0. Unlike the puncturing, the receiver knows the information that the values of these bits have been determined to be 0. Therefore, the LLR value of these bits is initially set to a very large value (the maximum value that can be set in hardware) before decoding. In 5G-NR, an effective shortening technique for polar codes, which are non-systematic codes, is reflected.

Meanwhile, error-floor refers to a phenomenon in which the absolute value of the slope of the error rate performance graph of a channel code decreases as the signal to noise ratio (SNR) increases. The polar codes have a shorter minimum distance than Reed-Muller codes that share a generation matrix, so they are not free from error-floor (the minimum distance of a code is an important factor in determining the fundamental ML decoding performance of the code). When a cyclic redundancy check (CRC) code is concatenated with an outer code, a code minimum distance is improved and invalid codewords are effectively removed in a high SNR region during SCL decoding, thereby improving decoding performance. As the length of CRC protection increases, effective codeword detection performance is improved, but decoding performance deterioration due to rate-loss becomes more noticeable in a high error rate region. Therefore, in order to compromise between code rate loss and detection efficiency in a high SNR region, it is assumed to use a CRC of limited length.

As representative polar code encoding/decoding methods utilizing (or concatenated) a CRC code corresponding to the disclosure, some method have been proposed such as K. Niu and K. Chen, "CRC-aided Decoding of Polar Codes" in IEEE Commun. Lett., vol. 16, no. 10, pp. 1668-1671, October 2012 (hereinafter referred to as [Niu12]), J. Guo et al., "Multi-CRC Polar Codes and Their Applications" in IEEE Commun. Lett., vol. 20, issue: 2, pp. 212-215, February 2016 (hereinafter referred to as [Guo15]), J. Kim, S. Kim, J. Jang, Y. Kim, "Low Complexity List Decoding for Polar Codes with Multiple CRC Codes" in MDPI Entropy, vol. 19, issue: 4, February 2017 (hereinafter referred to as [Kim17]), and Z. Qingshuang, I. Aijun, P. Xiaofei, "Efficient CRC Concatenation Scheme for Polar Codes" in IEEE Commun. Lett., vol. 22, issue: 11, pp. 2202-2205, August 2018 (hereinafter referred to as [Qingshuang17]). Specifically, from an encoding perspective, the CRC code is connected to the polar code as an outer code, and from a decoding perspective, the validity of the codeword is verified through a CRC check after SCL decoding. In this case, depending on the range of information bits whose validity is to be verified through the CRC code, it is divided into full protection (or blind protection) and partial protection. The full protection method applies the CRC outer encoding to the entire message, and verifies the validity of the CRC codeword applied to all information bits during decoding, whereas the partial protection method selectively applies the CRC encoding to some information bits that are judged to have low reliability, and verifies the validity of only the corresponding information bits during decoding. The partial protection technique can have the effect of increasing detecting efficiency by focusing the detection ability of the CRC code on verification of weak bits, and also have the effect of improving decoding performance by improving the error-floor in a high signal-to-noise ratio (SNR) region.

In the following description, [Niu12] and [Guo15], which are conventional techniques regarding the full protection method, will be referred to as "conventional technique 1", "first conventional technique", or "conventional technique according to a full protection method". In addition, [Kim17] and [Qingshuang17], which are conventional techniques regarding the partial protection method, will be referred to as "conventional technique 2", "second conventional technique", or "conventional technique according to a partial protection method".

Figure 2:
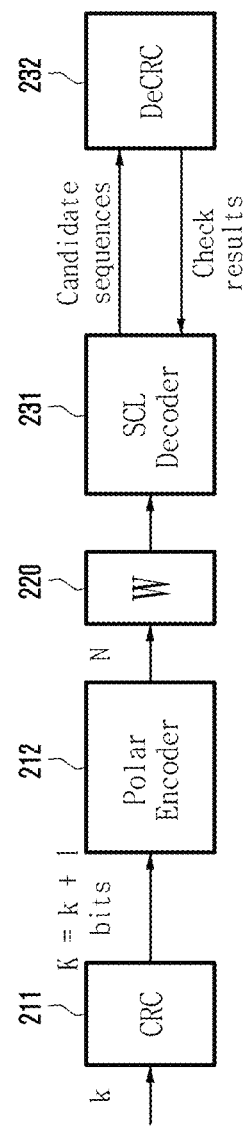
FIG. 2 is an exemplary diagram illustrating a simplified transmitter and receiver structure for CRC concatenated polar codes.

FIG. 2 is an exemplary diagram illustrating a simplified transmitter and receiver structure for CRC concatenated polar codes.

With reference to FIG. 2, the transmitter includes a CRC adder 211 and a polar encoder 212, a channel 220 denoted by W is between the transmitter and the receiver, and the receiver includes an SCL decoder 231 and a CRC detector 232.

The CRC code is the most widely used code for error detection in practical communication systems, and generates a CRC codeword with K=k+l through 1-bit CRC encoding on information bits with a length of k. Considering the CRC bit as part of source bits for an error correction code, the code rate is R=K/N. In this case, information bits and CRC bits are allocated to (k+l) bit channels with the highest reliability among N bit channels, and a set of their bit indices is expressed as A. Among them, an index set of bits to be used as information bits is expressed as Ain, and an index set of bits to be used as CRC bits is expressed as ACRC. $A = A_{in} \cup A_{CRC}$.

Table 1 below shows examples of code sequence, row weight, and polarization reliability (weight) for polar codes of N=16, K=8, and l=4.

TABLE 1

| Index | 15 | 14 | 13 | 11 | 7 | 12 | 10 | 9 | 6 | 5 | 3 | 8 | 4 | 2 | 1 | 0 |
|---|---|---|---|---|---|---|---|---|---|---|---|---|---|---|---|---|
| Weight | 16 | 8 | 8 | 8 | 8 | 4 | 4 | 4 | 4 | 4 | 4 | 2 | 2 | 2 | 1 | 0 |
| Polar. Weight | 5.3 | 4.3 | 4.1 | 3.9 | 3.6 | 3.1 | 2.9 | 2.7 | 2.6 | 2.4 | 2.2 | 1.7 | 1.4 | 1.2 | 1.0 | 0 |

In this case, in terms of polarization reliability (polarization weight), upper 12 (=K+1) bits are candidates for information bits and CRC bits, and thus A={15, 14, 13, 11, 7, 12, 10, 9, 6, 5, 3, 8}. Assuming a situation where the CRC is concatenated to the end of the information block, ACRC={12, 13, 14, 15}, and $A_{in} = A \setminus A_{CRC}$={11,7,10,9,6,5,3,8}

Afterwards, the SCL decoder 231 performs SCL decoding based on signals modulated through polar encoding and passed through a channel. At this time, the SCL decoder 231 outputs candidate sequences to the CRC detector, and the CRC detector 232 outputs a codeword corresponding to the most reliable decoding path among the candidate sequences as a final codeword.

A minimum distance is defined as the smallest value among the Hamming distances between two different codewords, and the minimum distance dmin of the polar code where the CRC code is not concatenated is expressed as Equation 3 below.

$$d_{polar} = \min_{i \in \mathcal{J}} 2^{wt(i)} \quad (0 \le i \le N-1) \quad \text{Equation 3}$$

Here, wt(i) refers to the number of 1s when a bit channel index i is binary expanded. For example, when the information set of (8,4) polar code is J={3, 5, 6, 7}, wt(3)=2, wt(5)=2, wt(6)=2, and wt(7)=4, so $d_{polar} = 2_2 = 4$. In general, the maximum likelihood (ML) decoding performance of channel codes is closely related to the minimum distance. Specifically, the ML (or ML-like) decoding performance of polar codes in a high SNR region can be expressed by an approximate equation such as Equation 4 below.

$$P_e \approx N_{d_{min}} Q\left(\sqrt{2 d_{min} R \frac{E_b}{N_0}}\right) \quad \text{Equation 4}$$

Here, Ndmin refers to the number of codewords with the minimum Hamming weight, R refers to the code rate, and E0/N0 refers to the bit energy per unit noise. That is, the larger the minimum distance (dmin) or the smaller the number of bits with the minimum weight (Ndmin), the better the decoding performance. However, the polar code with no concatenated CRC code has a relatively short minimum distance, which can cause error-floor in a high SNR region. The error-floor refers to a phenomenon in which the absolute value of the error rate slope in the SNR-error rate graph becomes smaller. To alleviate this problem, the previously mentioned "CRC-aided Decoding of Polar Codes" proposed a method of concatenating a CRC code to the end of an information block and verifying the validity of a codeword through a CRC check after decoding. Here, the 1-bit CRC generation polynomial and the corresponding CRC coefficient vector can be expressed as $p_1(x) = P_l x^l + P_{l-1} x^{l-1} + \ldots + P_1 x^1 = P_0 x^0$ and $p = [p_l, p_{l-1}, \ldots, p_1, p_0]$, respectively. In this case, the CRC code is used for the purpose of protecting all information bits without bias, so it is called 'full protection'. In the paper "Efficient CRC Concatenation Scheme for Polar Codes" described above, this method was referred to as blind protection. In addition, the paper "Multi-CRC Polar Codes and Their Applications" proposed a multi-CRC concatenated polar code technique in which an information block is divided into several sub-information blocks and each sub-information block is protected by a small-sized CRC. This technique has the effect of reducing memory space and latency with little performance loss compared to the technique proposed in the "CRC-aided Decoding of Polar Codes" paper, and it can be considered to belong to the category of 'full protection' technique such as "CRC-aided Decoding of Polar Codes". When the index set of information bits protected by the CRC code is Aprot, the protection area of the full protection technique is Aprot=Ain. The encoding procedure and information blocks for the full protection technique by CRC proposed in the above-mentioned [Niu12] and [Guo15] are shown in FIGS. 3A and 3B.

Figure 3A:
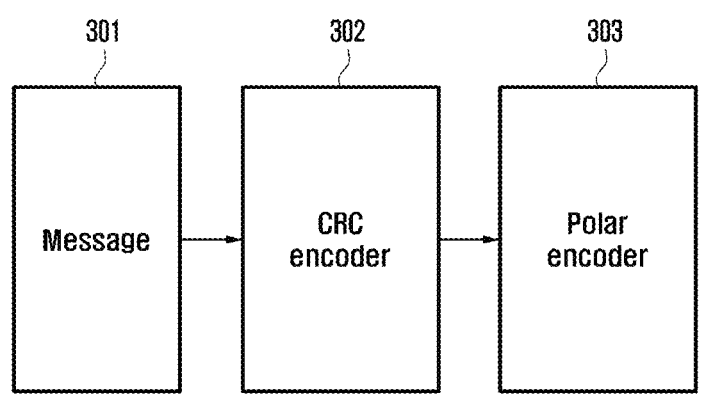
FIG. 3A is an exemplary diagram illustrating encoding for full protection technique by CRC.

FIG. 3A is an exemplary diagram illustrating encoding for full protection technique by CRC.

With reference to FIG. 3A, a message 301 is encoded through a CRC encoder 302 and a polar encoder 303. The message to be transmitted from an electronic device may be output with a cyclic code for error correction added in the CRC encoder 302. Then, the output of the CRC encoder 302 is input to the polar encoder 303. The polar encoder 303 can polar-encode information bits, to which CRC codes are added, in a predetermined manner and output them.

Figure 3B:
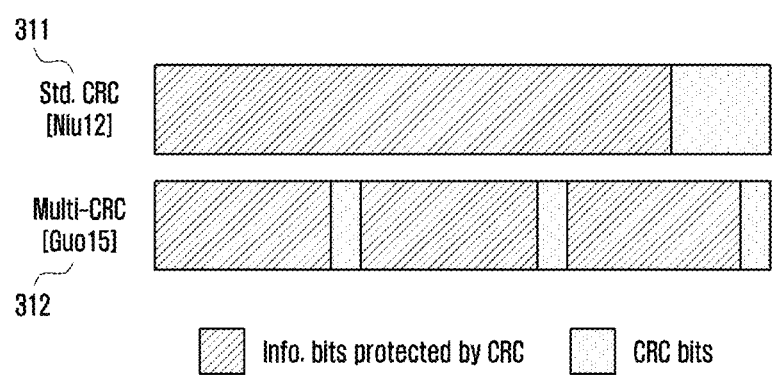
FIG. 3B is an exemplary diagram illustrating an information block using full protection technique by CRC proposed by [Niu12] and [Guo15].

FIG. 3B is an exemplary diagram illustrating an information block using full protection technique by CRC proposed by [Niu12] and [Guo15].

Information bits according to the [Niu12] and [Guo15] schemes illustrated in FIG. 3B can be information after CRC encoding. As shown in FIG. 3B, CRC bits according to the [Niu12] scheme 311 are added to the end of the information bits. On the other hand, CRC bits according to the [Guo15] scheme 312 are inserted in the middle of the information bits.

Messages $u_1^K=(u_1,u_2,\ldots,u_K)$ are all outer-encoded with CRC codes without bias to generate $v_1^{K+1}$, and this vector is polar-encoded to become a codeword $x_1^N$.

As described above, the ML (or ML-like) decoding performance of polar codes is closely related to the number of codewords with minimum weight. However, the effect of each information bit on the number of codewords with minimum weight is not the same. In other words, depending on the reliability of the information bits, the information bits have different effects on the number of codewords with minimum weight. Thus, in order to increase the detecting efficiency of CRC codes during the SCL decoding of polar codes, the paper [Qingshuang17] proposed a 'partial protection' technique that applies CRC encoding only to some information bits.

In this case, the information bits to be protected by CRC should be information bits that have a significant impact on the number of codewords with the minimum Hamming weight, and these bits are defined as 'crucial information bits (CIB)'. In addition, in the previously described paper [Qingshuang17], the information bits corresponding to the minimum Hamming weight among the bits in the information set were defined as CIB, and CRC protection was selectively applied only to these. If the index set of information bits is Ain, the index set of information bits corresponding to the minimum Hamming weight is Aml, and the area of information bits to be protected by CRC is Aprot, then the CRC protection area of the previously described paper [Qing17] is Aprot=Aml.

Figure 4A:
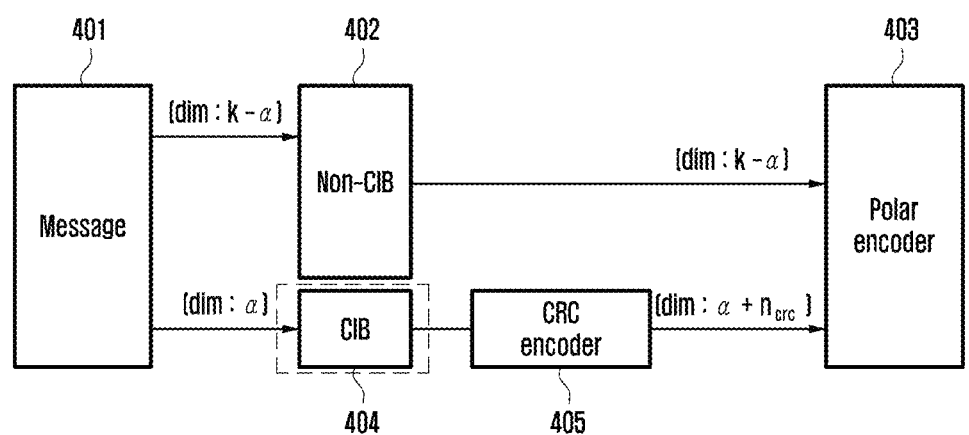
FIG. 4A is an exemplary diagram illustrating an encoding procedure of partial protection technique using CRC codes.

FIG. 4A is an exemplary diagram illustrating an encoding procedure of partial protection technique using CRC codes.

With reference to FIG. 4A, it can be seen that a message 401 is output while being divided into a CIB 404 and a non-CIB 402. The CIB 404 undergoes CRC encoding in a CRC encoder 405. The CRC encoding may mean that a protection bit by CRC is added and output in the CRC encoder 405. On the other hand, the non-CIB 402 is directly input to a polar encoder 403 without a protection bit by CRC added in the CRC encoder 405. Additionally, both the information bits encoded in the CRC encoder 405 and the information bits that are not CRC-encoded may be input to the polar encoder 403 and polar encoding may be performed based on a predetermined scheme.

Figure 4B:
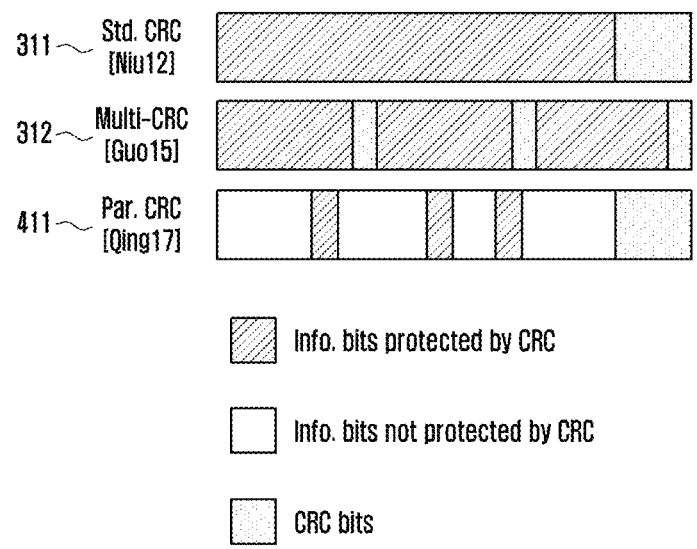
FIG. 4B is an exemplary diagram comparing the relationship between information bits and CRC previously described in FIG. 3B with the encoding scheme according to FIG. 4A.

FIG. 4B is an exemplary diagram comparing the relationship between information bits and CRC previously described in FIG. 3B with the encoding scheme according to FIG. 4A.

As described above in FIG. 3B, CRC bits according to the [Niu12] scheme 311 are added to the end of the information bits. On the other hand, CRC bits according to the [Guo15] scheme 312 are inserted in the middle of the information bits.

However, in the case of using the [Qing17] scheme 411 as shown in FIG. 4A, CRC is added to only some of the information bits, and information bits protected by the CRC among the information bits are different. This is illustrated in FIG. 4B such that the information bits protected by the CRC can be identified.

Figure 5A:
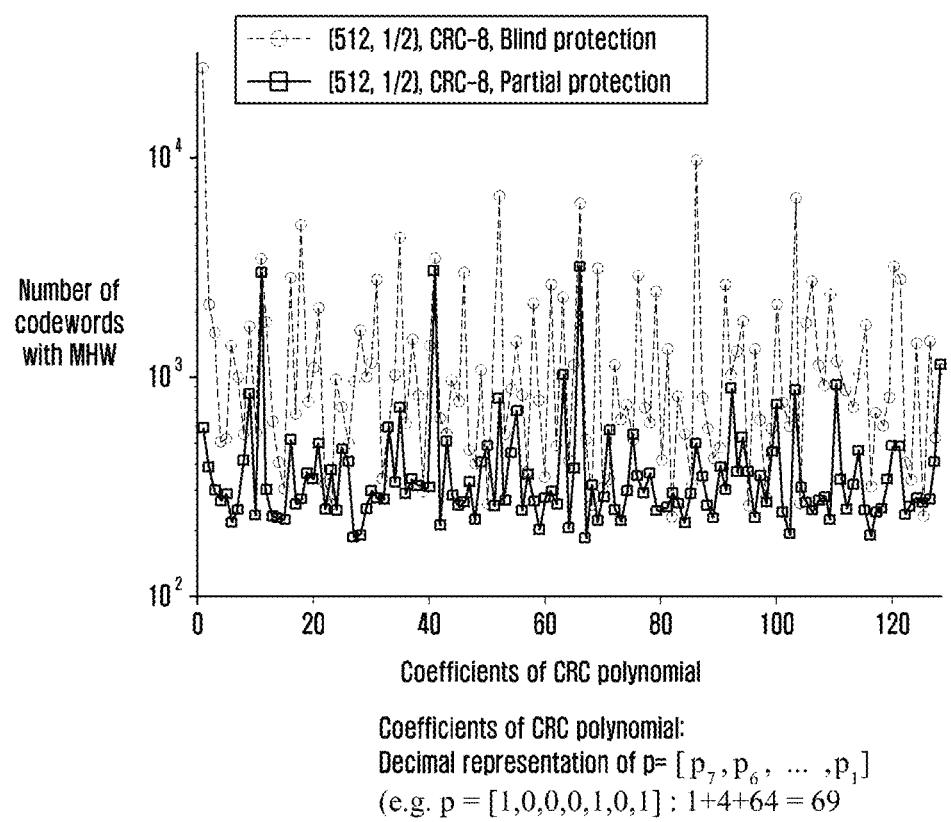
FIGS. 5A and 5B are graphs comparing the number of minimum Hamming weight (NMHW) of codewords having the minimum Hamming weight in the case of applying the schemes of [Niu12] and [Guo15], which are the first described conventional techniques, and the scheme of [Qing17], which is the second described conventional technique, according to the coefficients of CRC polynomial.
Figure 5B:
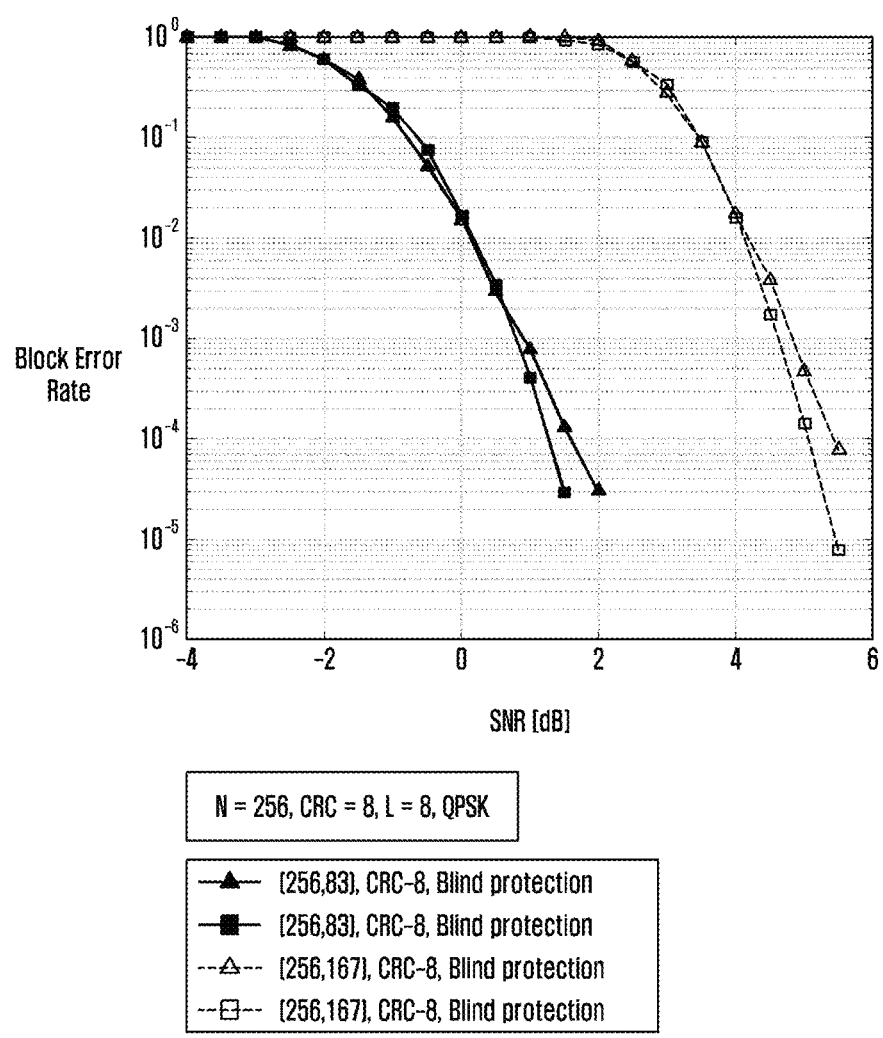

FIGS. 5A and 5B are graphs comparing the number of minimum Hamming weight (NMHW) of codewords having the minimum Hamming weight in the case of applying the schemes of [Niu12] and [Guo15], which are the first described conventional techniques, and the scheme of [Qing17], which is the second described conventional technique, according to the coefficients of CRC polynomial.

In FIG. 5A, the X-axis denotes the coefficients of CRC polynomial, which represent CRC for a total of 128 (=27) cases in which p=[p_1, p_(l−1), . . . , p_1, p_0] is expressed in decimal. In addition, the Y-axis in FIG. 5A denotes NMHW when a specific CRC polynomial is applied. Since the ML (or ML-like) decoding performance of a code is closely related to dmin and NHMW, the smaller the NMHW, the better the decoding performance of the code. In the above-described [Qingshuang17], it can be seen that when applying the above-described second technique in a specific code parameter, the NMHW was effectively reduced compared to the case of applying the first technique.

In a graph of FIG. 5B, the x-axis denotes SNR, and the y-axis denotes the block error rate. As can be seen in FIG. 5B, when applying the second technique, the decoding performance can be improved compared to when applying the first technique.

FIG. 6 is an exemplary table illustrating the qualities of bit channels in descending order of reliability in the case of polar codes with N=32, k=12, and l=6.

In the disclosure, quality refers to, for example, polarization reliability (or polarization weight). FIG. 6 shows the index, row weight, and polarization reliability for upper 18 (=K+l) bits in the descending order of reliability.

In other words, it expresses only the profiles of bits to be used as information bits and CRC bits, and A={31,30, 29, . . . ,24,7,20}. For example, in the case of a bit with index '31', the row weight is 32, and the polarization reliability is 7.3. Assuming a situation where a CRC code (l=6) is concatenated to the end of an information block, ACRC={26,27,28,29,30,31}. In this case, an index set of information bits is Ain=A\ACRC={23,15,25,22,21,14,19, 13,11,24,7,20}, where the absolute value of Ain is 12.

To summarize the first conventional techniques [Niu12], [Guo15], and [Kim17], in the case of a full protection, all information bits are protected without bias, so a CRC protection area Aprot, 1 can be expressed as follows.

Aprot, 1=Ain={23,15,25,22,21,14,19,13,11,24,7,20}

On the other hand, the second conventional technique [Qingshuang17] applies CRC only to information bits with the lowest row weight (dmin) among bits in Ain in the case of a partial protection. In the case of FIGS. 5A and 5B described above, since dmin is 4, a CRC protection area Aprot,2 can be expressed as follows.

$A_{prot,2}=\{i\in A_{in}|w_N^{(i)}=d_{min}=4\}=\{24,20\}$

As a result, $|A_{prot,1}|=12$, $|A_{prot,2}|=2$.

In the disclosure described below, the design of CRC concatenated polar codes aims at further improving the decoding performance of the CRC concatenated polar codes through a selection and protection strategy of a CRC protection area adaptive to a protection level, i.e., the number of weak bits in the information set Ain of the polar codes. Specifically, an improved CRC partial protection technique with a low error-floor is newly proposed. This may be explained in various modes, for example, a first mode (mode 1: partial) and a second mode (mode 2: full). Alternatively, modes may be set as a first mode (mode 1: partial), a second mode (mode 2: partial according to the disclosure), and a third mode (mode 3: full). Hereinafter, an improved CRC concatenated polar code algorithm that can secure improved decoding performance will be described according to mode-specific operations.

As described above, the polar codes improve the existing distance spectrum characteristics through the concatenation of CRC codes and have improved decoding performance through SCL decoding. Also, it is possible to further enhance detecting efficiency through a partial protection method using the CRC codes. However, when the partial protection methods described in the conventional techniques are applied, 1) in the case where stable decoding performance needs to be supported in various code parameters, and 2) in the case of actual standards where modulation and coding scheme (MCS) is considered, there occur many areas where decoding performance deteriorates. In the disclosure, through previous research and review, it has been confirmed that the bit configuration of the area protected by the CRC code is greatly affected when the partial protection technique is applied. Accordingly, the disclosure will describe a modified CRC protection area determination method that takes all the advantages of the conventional techniques in various code parameters and also has improved decoding performance in some code parameters.

(1) First, the definitions of a code sequence (Acode) and subsequence $(A, A_m^1, A_m^2)$ of the polar codes will be described.

The code sequence Acode of polar codes is a permutation that is listed in descending order according to the reliabilities of bit channels $W_M^{(i)} (i \in \{0,1,\ldots,N-1\})$. The reliability of each bit channel can theoretically be evaluated by channel capacity and Bhattacharyya parameters, but direct calculation of these metrics in a general channel is very complicated. Instead, the quality of a bit channel can be approximated through various methods such as density evolution [Mori09], Gaussian approximation [Trifonov12], and polarization weight [Hel7]. The code sequence (descending index sequence) of polar codes obtained by a specific method is denoted as Acode. The dimension of Acode is N. In this case, the index set (or sequence, matrix) Ain of more reliable (K+1) bits (K: the number of information bits, 1: the number of CRC bits) is Ain=Acode(1:K+1). Additionally, the minimum value dmin of the row weights corresponding to bits in the set Ain can be expressed as Equation 5 below.

$$d_{min} = \min(\{W_N^{(i)}\})(i \in A_{in}) \qquad \text{Equation 5}$$

In Equation 5, $W_N^{(i)}$ is a polar code generation matrix $$G_N = G_2^{\otimes n}\left(G_2 = \begin{bmatrix} 1 & 0 \\ 1 & 1 \end{bmatrix}\right),$$

and $(\bullet)^{\otimes}$ is a row weight corresponding to the i-th bit channel $W_N^{(i)}$ the Kronecker product.

In addition, among bit indices in the set Ain, the index sets of bits with the minimum Hamming weight (dmiin) and twice dmin can be expressed respectively as Equation 6 below.

$$A_m^1 = \{i \in A_{in} | w_N^{(i)} = d_{min}\}$$

$$A_m^2 = \{i \in A_{in} | w_N^{(i)} = 2d_{min}\} \qquad \text{Equation 6}$$

(2) Next, the definitions of a protection area (Aprot) and a polarization reliability set $(R_{N,m}^1, R_{N,m}^2)$ by CRC will be described.

As described above, for given Ain and ACRC, the index set of information bits to be protected by the CRC code is called Aprot. In addition, $R_N^{(i)}$ refers to the polarization reliability value of the i-th bit channel, and $R_N = \{R_N^{(0)}, R_N^{(1)}, \ldots, R_N^{(N-1)}\}$.

In addition, the polarization weight/reliability sets corresponding to bits defined in Equation 6 of (1) are expressed as $R_{N,m}^1, R_{N,m}^2$, respectively. That is, $R_{N,m}^1(i) = R_N^{(A_m^1(i))}$. Also, the maximum element values (i.e., the maximum polarization reliability values) in $R_{N,m}^1, R_{N,m}^2$ are defined as $\max(R_{N,m}^1), \max(R_{N,m}^2)$, respectively.

Figure 7:
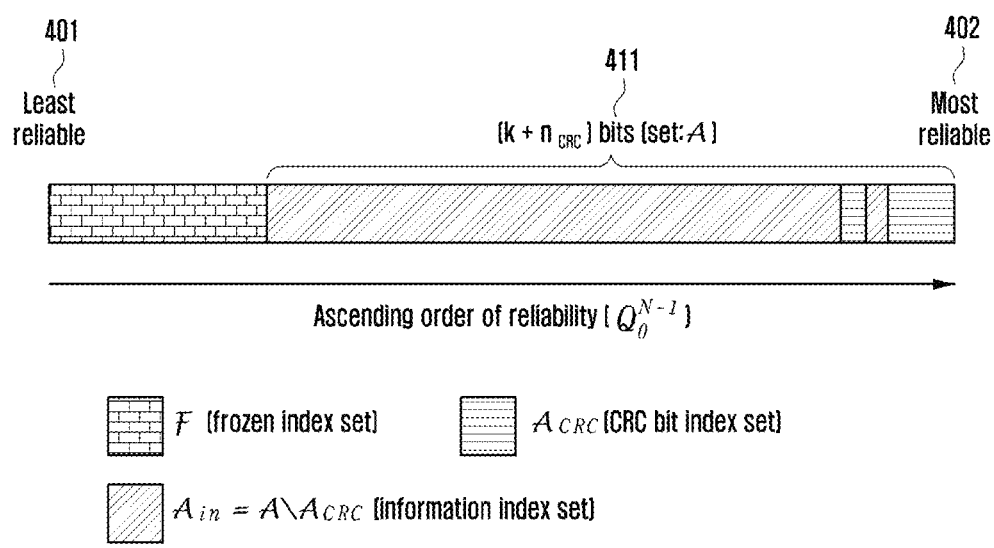
FIG. 7 is an exemplary diagram illustrating the configuration of an information block for CRC concatenated polar codes.

FIG. 7 is an exemplary diagram illustrating the configuration of an information block for CRC concatenated polar codes.

With reference to FIG. 7, shown is a configuration in the ascending order of reliability from the least reliable 401 to the most reliable 402. In addition, shown is a case where a set A 411 of (K+nCRC) bits is located in an area of the most reliable 402. In addition, the bit set A 411 includes a CRC bit index set ACRC and an information index set Ain, and excludes a frozen index set.

The set defined in FIG. is expressed, for example, as follows.

Figure 8A:
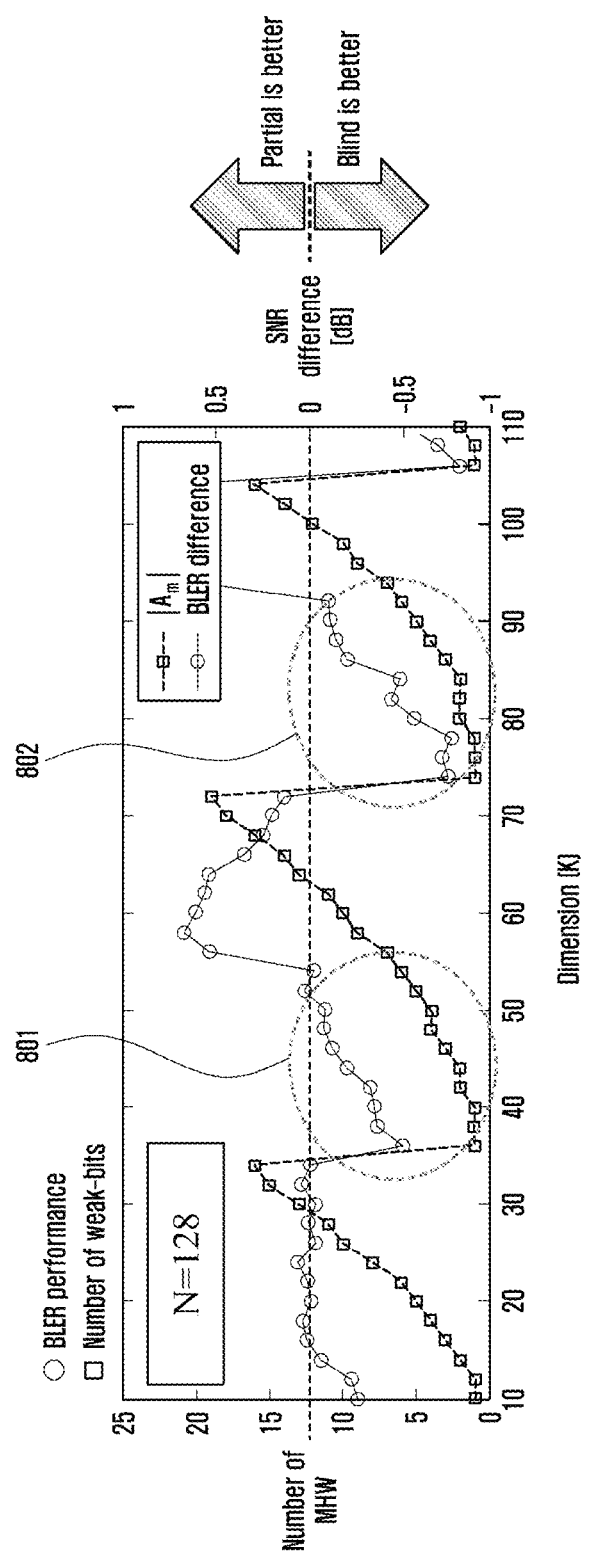
FIGS. 8A and 8B are graphs illustrating the BLER performance comparison between conventional techniques and the protection area of partial protection technique for N=128 and N=256, respectively.
Figure 8B:
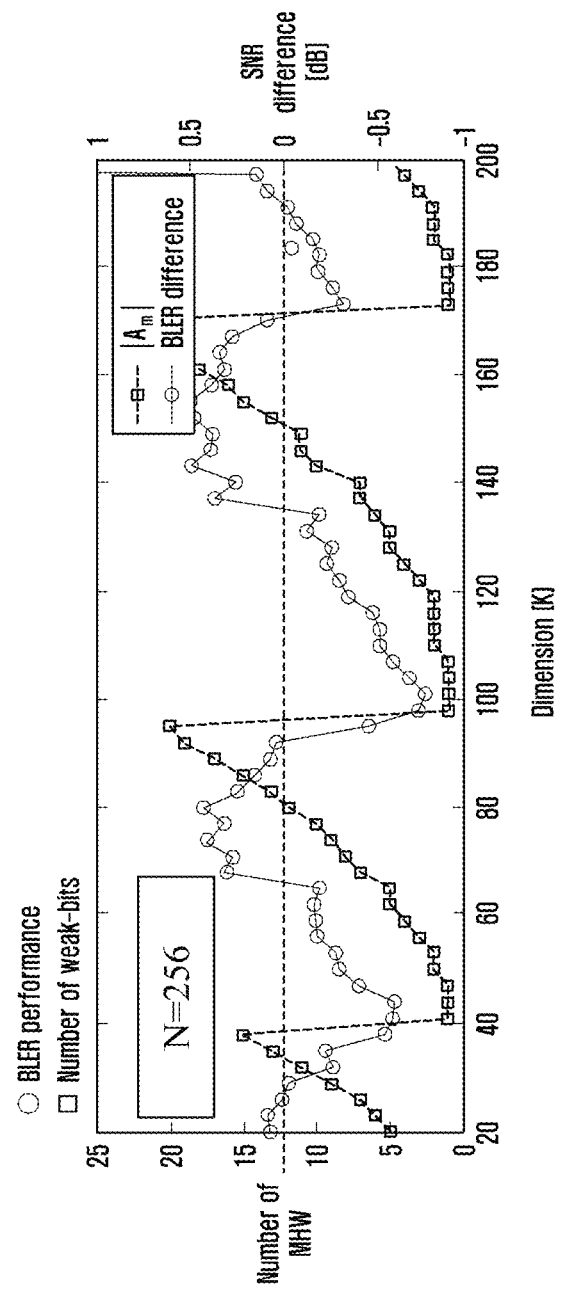

1) A={31,30,29,27,23, . . . ,24,7,20} (an index set of information bits and CRC bits)
2) dmin=4 (the minimum value among weights corresponding to bits in the set A)
3) $A_m^1 = \{i \in A | W_{32}^{(i)=d}{}_{min} = 4\} = \{24,20\}$ (An index set of weak bits)
4) $A_m^2 = \{i \in A | W_{32}^{(i)} = 2d_{min} = 8\} = \{28,26,25,\ldots,11,7\}$ (An index set of next-weak bits)
5) R32={7.3,6.3,6.1,5.9,5.6, . . . ,3.7,3.6,3.4} (A polarization reliability set corresponding to A)
6) $R_{32,m}^1 = \{3.7,3.4\}$ (A polarization reliability set corresponding to $A_m^1$)
7) $R_{32,m}^2 = \{5.1,4.9.4.7 \ldots ,3.9.3.6\}$ (A polarization reliability set corresponding to $A_m^2$)
8) $\max(R_{32,m}^1) = 3.7$, $\max(R_{32,m}^2) = 5.1$ FIGS. 8A and 8B are graphs illustrating the BLER performance comparison between conventional techniques and the protection area of partial protection technique for N=128 and N=256, respectively.

FIGS. 8A and 8B are described in detail. FIG. 8A shows $|A_m^1|$ according to N=128, L=8, and $p_{11}(x) = x^{11} + x^9 + x^8 + x^7 + x^2 + 1$ (p=[10111000101]) K (the number of information bits), and a difference in error rate performance when applying the conventional technique 2 compared to the conventional technique 1.

Additionally, in a simulation of FIG. 8A, quadrature phase shift keying (QPSK) modulation and additive white Gaussian noise (AWGN) channel were applied. Specifically, a graph indicated with a rectangular label represents the number of weak bits included in the set A according to the number of information bits, and a graph indicated with a circular label represents the value obtained by subtracting the required SNR [dB] satisfying BLER=10-4 of the conventional technique 2 from the required SNR [dB] satisfying BLER=10-4 of the conventional technique 1. If the value is greater than 0, the performance of conventional technique 2 is better, and if the value is less than 0, the performance of conventional technique 1 is better.

In this case, when observing sections 801 and 802 indicated by dotted circles, it can be seen that if the number of weak bits ($|A_m^1|$) is less than a certain threshold tth (i.e., the protection level by the CRC code is below a certain level), areas where the decoding performance of the conventional technique 2 is rather worse than that of the conventional technique 1 occur regularly. Specifically, if the number of $|A_m^1|$ is less than a certain threshold, the graph indicated by the circle label is located below the y-axis (deterioration in performance compared to the conventional technique 1), and otherwise, it is located above the y-axis (improvement in performance compared to the conventional technique 1). This tendency appears in a similar form even in the case of N=256 in FIG. 8B. Based on these observations, the disclosure seeks to improve the decoding performance through two types of protection strategies depending on the protection level.

1. Method of selecting (determining) CRC protection area (or CIB) in case of $|A_m^1|<\tau_{th}$ The conventional technique has a relationship of $A_{prot}=A_m^1$ regardless of the configuration of bits in the information set A. That is, the minimum weight is used as the only criterion for selecting the CRC protection area. However, if the protection level is lower than a certain threshold, the detecting efficiency of the CRC code decreases rather. Therefore, the disclosure allows all bits with low reliability in terms of row weight and polarization reliability (polarization weight) to be protected by the CRC code. First, in terms of weight, the range of samples to be protected is expanded from the conventional dmin to 2dmin. Thereafter, in terms of polarization reliability, even all bits equal to or smaller than the highest polarization reliability value max $(R_{32,m}^2)$, from among bits with a weight of 2dmin, are allowed to be protected. This is to detect, by CRC, errors that may occur in bits that are judged to have low reliability in terms of weight or polarization reliability. That is, in the case of $|A_m^1|<\tau_{th}$, the protection area according to the disclosure is $A_{prot}=\{i \in A | R_N^{(i)} \leq max(R_{32,m}^2)\}$.

2. Method of selecting (determining) CRC protection area (or CIB) in case of $|A_m^1| \geq \tau_{th}$ The conventional technique has a relationship of $A_{prot}=A_m^1$ regardless of the configuration of bits in the information set A. That is, the minimum weight is used as the only criterion for selecting the CRC protection area. As discussed above, the disclosure allows all bits with low reliability in terms of weight and polarization reliability (polarization weight) to be protected by the CRC code. First, in terms of weight, the range of samples to be protected is maintained at the conventional dmin. However, in terms of polarization reliability, even all bits equal to or smaller than the highest polarization reliability value $max(R_{N,m}^1)$, from among bits with a weight of dmin, are allowed to be protected. For example, if the row weights corresponding to bit channels with indices a, b, and c are dmin, 2dmin, and dmin, respectively, and the polarization reliabilities are $R_N^{(a)}, R_N^{(b)}, R_N^{(c)}$ $(R_N^{(a)} > R_N^{(b)} > R_N^{(c)})$, respectively, then the conventional technique protects only bit channels with indices a and c (therefore, only bit channels with dmin are protected by CRC). However, the disclosure protects even bit channels with an index of b, which may be weak to errors in terms of polarization reliability, even if the weight is greater than dmin. That is, in this case, the indices of bit channels protected by the disclosed technique are a, b, and c. As a result, in the case of $|A_m^1|<\tau_{th}$, the protection area of the technique according to the disclosure is $A_{prot}=\{i \in A | R_N^{(i)} \leq max(R_{N,m}^1)\}$.

An algorithm used in the method of selecting a CRC protection area for CRC concatenated polar codes according to the disclosure is illustrated in Table 2 below. Hereinafter, the algorithm in Table 2 will be referred to as algorithm 1.

TABLE 2

| Algorithm: Proposed CIB selection rule |
|---|
| 1: Input $\|A_m^1\|$ |
| 2: Output $A_{prot}$ |
| 3: if $\|A_m^1\| < \log_2 N$ then |
| 4:    $A_{prot} = \{ i \in A \| R_N^{(i)} \leq P_{max}^2 \}$ ; |
| 5: else |
| 6:    $A_{prot} = \{ i \in A \| R_N^{(i)} \leq P_{max}^1 \}$ ; |
| 7: end |

As described above, the disclosure adopts two types of CRC protection strategies according to the protection level (the number of weak bits in the information set).

FIG. 9 is an exemplary diagram illustrating CRC protection areas in the disclosure and a conventional technique when the number of weak bits in an information set is less than a predetermined threshold value.

Shown are a CRC protection area 901 according to the conventional technique and a CRC protection area 902 according to the disclosure when the number of weak bits in the information set is less than a certain threshold (i.e., $\log_2 N$).

The parameters according to the example in FIG. 9 are N=32, k=10, and l=6.

Assuming a situation where the CRC code is concatenated at the end of an information block, $A_{CRC}=\{26,27,28,29,30,31\}$. In the case of the conventional technique 1, the protection area by the CRC code is $A_{prot,1}=A_{in}$. In the case of the conventional technique 2, since the CRC code is applied only to bits with MHW, $A_{prot,2}=A_m^1=\{24\}$.

However, based on determining that the protection level of the conventional technique 2 is too low, the disclosure expands the range of samples to be protected in terms of weight to $2d_{min}$ (in this example, the weight is 8). Furthermore, all bits that are equal to or smaller than the largest value among the polarization reliabilities corresponding to bits with a weight of $2d_{min}$ are protected. That is, bits with a row weight greater than $2d_{min}$ can also be protected (e.g., $4d_{min}$). In other words, all bits with a polarization reliability equal to or less than $P_{max}^2$ are protected by CRC, and this is expressed as a set $A_{prot,3}=\{i \in A_{in} | R_N^{(i)} \leq P_{max}^2\}=\{25,22,21,14,19,13,11,24\}$. In addition, the number of bits protected by each technique is $|A_{prot,1}|=10$, $|A_{prot,2}|=1$, $|A_{prot,3}|=8$.

FIG. 10 is an exemplary diagram illustrating CRC protection areas in the disclosure and a conventional technique when the number of weak bits in an information set is greater than or equal to a predetermined threshold value.

Shown are CRC protection areas 1001 and 1002 according to the conventional techniques and a CRC protection area 1003 according to the disclosure when the number of weak bits in the information set A is equal to or greater than a certain threshold (i.e., $\log_2 N$).

Specific parameters are N=32, k=16, and l=6. As in the above-described example, assuming a situation where the CRC code is concatenated at the end of an information block, $A_{CRC}=\{26,27,28,29,30,31\}$. The area protected by the CRC in the conventional technique 1 is $A_{prot,1}=A_{in}=\{23,15,25,\ldots,17,10\}$, and $|A_{prot,1}|=16$. However, in the case of the conventional technique 2, bits having $d_{min}$ (=4) become targets of CRC protection, and $|A_{prot,2}|=A_m^1=\{24,20,18,12,17,10\}$.

On the other hand, based on determining that the protection level of the conventional technique 2 is somewhat high, the disclosure maintains the range of samples to be protected in terms of weight at $d_{min}$, but it includes all bits with low polarization reliability in the protection range. For example, a bit with an index of '7' does not have the minimum weight, but it has a lower polarization reliability than that of a bit with an index of '24'. Such bits are included in the protection area by the CRC code (that is, all bits with low reliability in terms of weight and polarization weight are included in the CRC protection area). As a result, $A_{prot,3} = \{i \in A_{in} | R_N^{(i)} \leq P_{max}^1\} = \{24, 7, 20, 18, 12, 17, 10\}$, $|A_{prot,3}| = 7$.

Figure 11A:
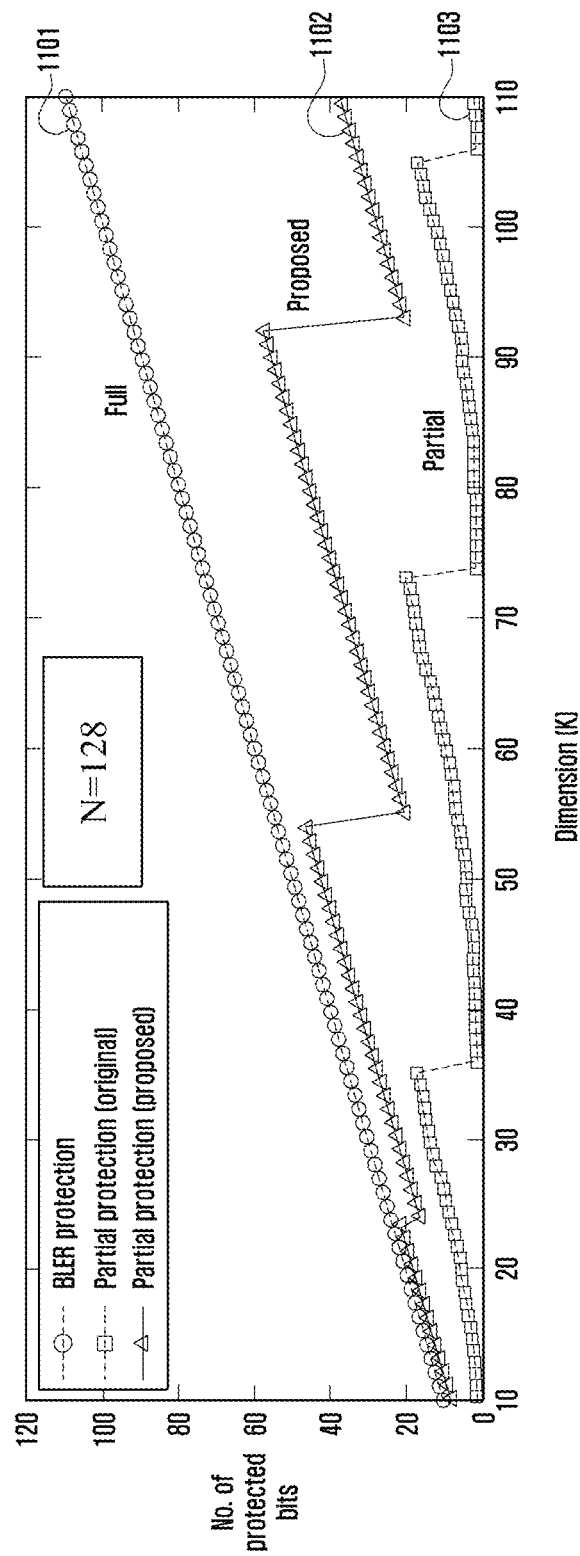
FIGS. 11A and 11B are graphs comparing protection area sizes according to the number of information bits of various CRC concatenation techniques.
Figure 11B:
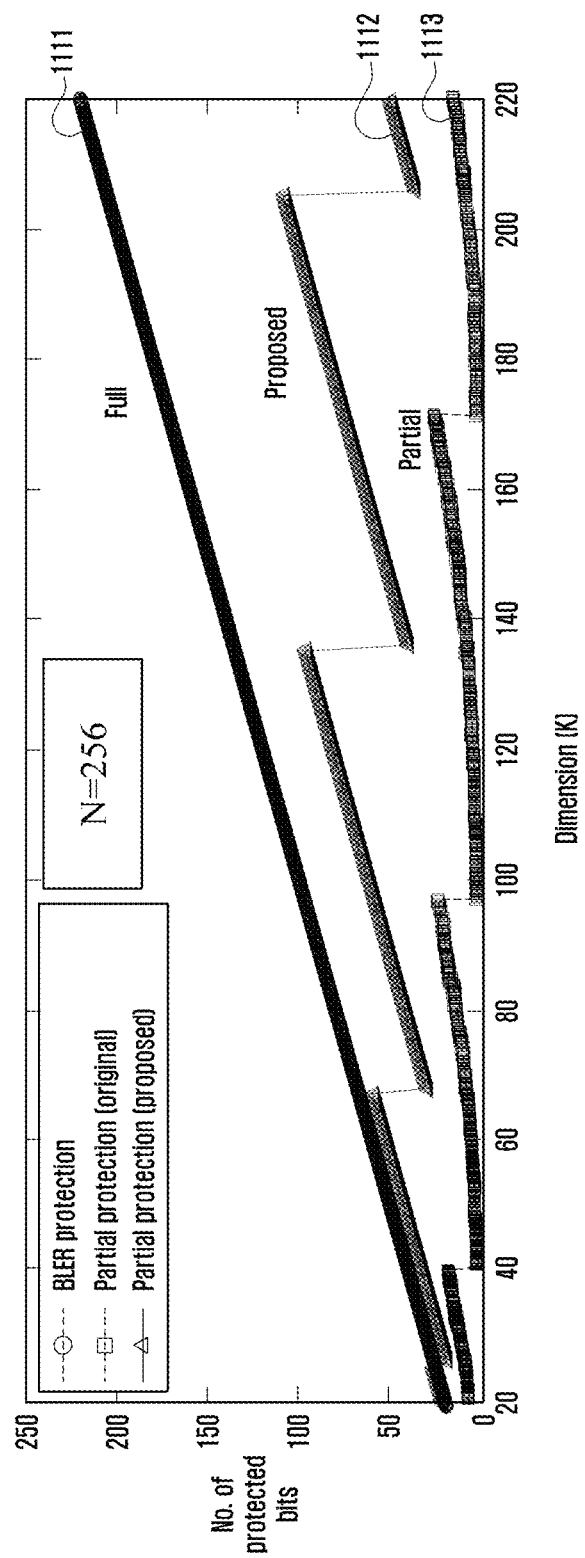

FIGS. 11A and 11B are graphs comparing protection area sizes according to the number of information bits of various CRC concatenation techniques.

The only difference is that FIG. 11A shows the case of N=128 and FIG. 11B shows the case of N=256. In both FIGS. 11A and 11B, the X (horizontal) axis represents the number of information bits, and the Y (vertical) axis represents the number of information bits protected by the CRC code. In the case of the conventional technique 1, since all information bits are protected by the CRC code, graphs 1101 and 1111 are y=x. In the case of the conventional technique 2, since only bits with the minimum weight are protected by the CRC code, graphs 1103 and 1113 have a repeating pattern in which the number of $|A_m^1|$ in the set A increases, then decreases to 1, and then increases again. In contrast, in the case of the technique proposed in the disclosure, the CRC protection area is adaptively determined depending on the number of $|A_m^1|$ in the information set. For example, graphs 1102 and 1112 are obtained by setting the threshold τ to $\log_2 N$ and determining the CRC protection area through comparison in magnitude between $|A_m^1|$ and $\log_2 N$.

Figure 12:
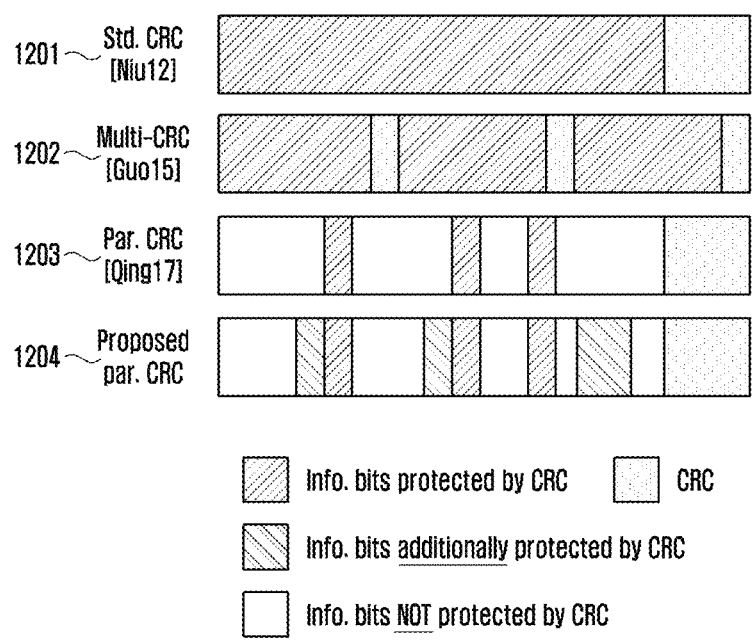
FIG. 12 is an exemplary diagram illustrating configurations for a CRC bit concatenation technique according to the disclosure and for conventional CRC bit concatenation techniques.

FIG. 12 is an exemplary diagram illustrating configurations for a CRC bit concatenation technique according to the disclosure and for conventional CRC bit concatenation techniques.

Referring to FIG. 12, in the CRC concatenation technique 1201 of Std. CRC scheme according to [Niu12] of the conventional technique 1, all information blocks are protected by CRC, and a CRC code is concatenated at the end of an information block.

In addition, in the CRC concatenation technique 1202 of multi-CRC scheme according to [Guo15] of the conventional technique 1, an information block is divided into several sub-information blocks, and each sub-information block is protected by a CRC code.

Also, in the Par. CRC concatenation technique 1203 according to [Qing17] of the conventional technique 2, only some bits are protected by a CRC code.

Lastly, in the CRC concatenation technique 1204 according to the disclosure, low-reliability bits, including the protected bits of the conventional technique 2, are additionally protected by CRC.

In the case of the CRC concatenation technique 1204 according to the disclosure, it can be seen that a CRC normally generated for all information bits is added to the end of the information bits. Also, it can be seen that weak bits are bits with low reliability in terms of row weight and polarization weight, and a CRC generated for them is located immediately after the corresponding information bit.

Figure 13A:
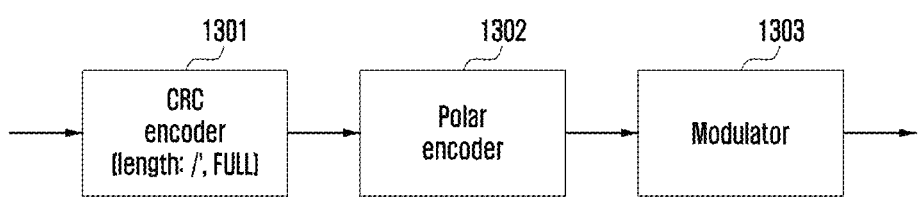
FIG. 13A is an exemplary diagram illustrating a transmitter model when applying a conventional full protection technique by CRC.
Figure 13B:
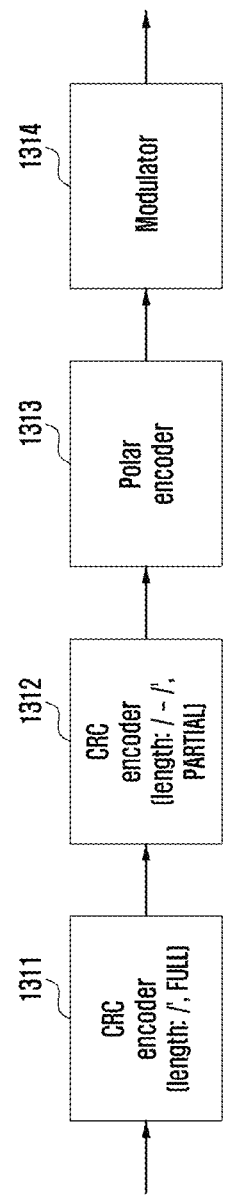
FIG. 13B is an exemplary diagram illustrating a transmitter model when using a CRC concatenation technique according to the disclosure.

FIG. 13A is an exemplary diagram illustrating a transmitter model when applying a conventional full protection technique by CRC, and FIG. 13B is an exemplary diagram illustrating a transmitter model when using a CRC concatenation technique according to the disclosure.

First, with reference to FIG. 13A, information bits can be encoded by a CRC encoder 1301. At this time, the length of a CRC 1 can be selected as a length for full protection. In this case, a CRC code protects all message bits without bias, thereby ensuring data integrity. Thereafter, the information encoded in the CRC encoder 1301 can be input to a polar encoder 1302 and encoded. Here, the CRC encoder 1301 can be an outer encoder, and the polar encoder 1302 can be an inner encoder. Symbols encoded by polar codes can be modulated in a modulator 1303 and transmitted.

With reference to FIG. 13B, a first CRC encoder 1311 according to the disclosure can perform CRC encoding on all information bits with a length of l'. This is a case where the number of CRC bits used to ensure data integrity is limited to the number of l'. Then, information to which a CRC is added in the first CRC encoder 1311 can be input to a second CRC encoder 1312. The second CRC encoder 1312 may be configured to provide additional CRCs to weak information bits according to the disclosure. Additionally, the length of the CRC added in the second CRC encoder 1312 may be determined by subtracting the length l' used in the first CRC encoder 1311 from the length l of the entire CRC used in FIG. 13A. That is, the disclosure may be a system model of a hybrid protection (full protection+proposed partial protection) method for data integrity of the partial protection technique. Therefore, the first CRC encoder 1311 and the second CRC encoder 1312 use the CRC to ensure data integrity. In this case, the number of CRC bits used in the first CRC encoder 1311 is l', and the number of CRC bits used in the second CRC encoder 1312 that uses the partial protection method to further improve performance is l-l'. As a result, the sum of the total CRC bits of the first and second CRC encoders 1311 and 1312 is l, which is the same as the number of CRC bits used in the CRC encoder 1301 described above in FIG. 13A. This may have the same form as the information word CRC encoded bits 1204 according to the disclosure among the information words to which the CRC bit is added as described previously in FIG. 12. Implementation like this is to keep the code rate the same. Therefore, the transmitter according to the disclosure can ensure data integrity and also improve decoding performance by considering full protection and partial protection in combination.

Afterwards, polar encoding is performed in a polar encoder 1313, and polar-encoded symbols can be modulated in a modulator 1314 and transmitted.

Figure 14:
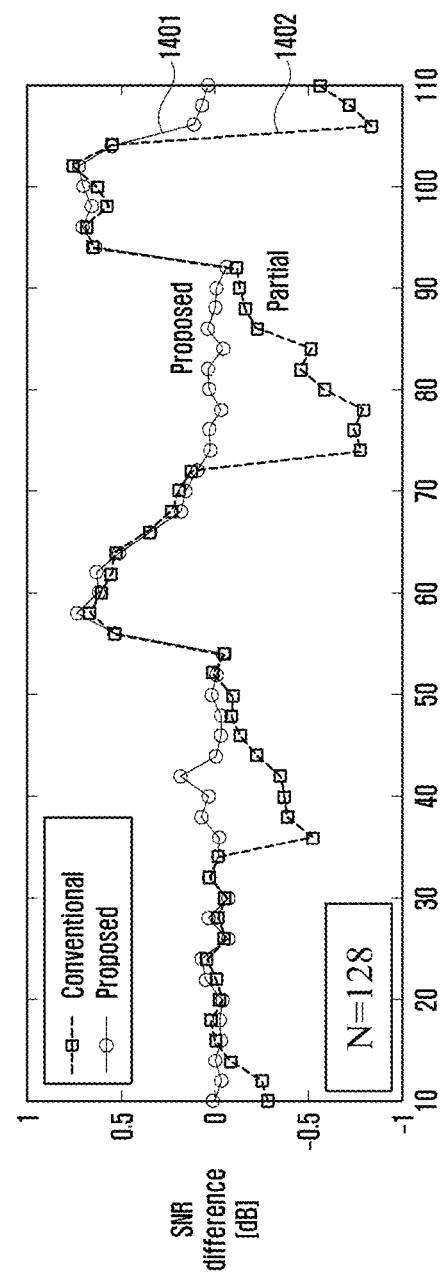
FIG. 14 is a simulation graph comparing performance between a scheme according to the disclosure and a scheme of conventional technique 1.

FIG. 14 is a simulation graph comparing performance between a scheme according to the disclosure and a scheme of conventional technique 1.

FIG. 14 is a graph obtained through a simulation of 2-bit fine granularity performed at a code length of N=128. In addition, quadrature phase shift keying (QPSK) modulation and additive white Gaussian noise (AWGN) channel were assumed, and the graph plots performance gain [dB] compared to SNR that satisfies BLER=$10^{-4}$ of blind protection technique. Also, 11-bit CRC and SCL decoding with a list size of 8 were considered.

In detail, it represents a difference between the required SNR [dB] that satisfies BLER=$10^{-4}$ of the conventional technique 1 (full protection) and the SNR [dB] of the technique according to the disclosure (improved partial protection, circle label). In the graph of FIG. 14, if it is greater than 0, it means that the performance of the technique according to the disclosure is better, and if it is less than 0, it means that the decoding performance of the conventional technique 1 is better.

Figure 15:
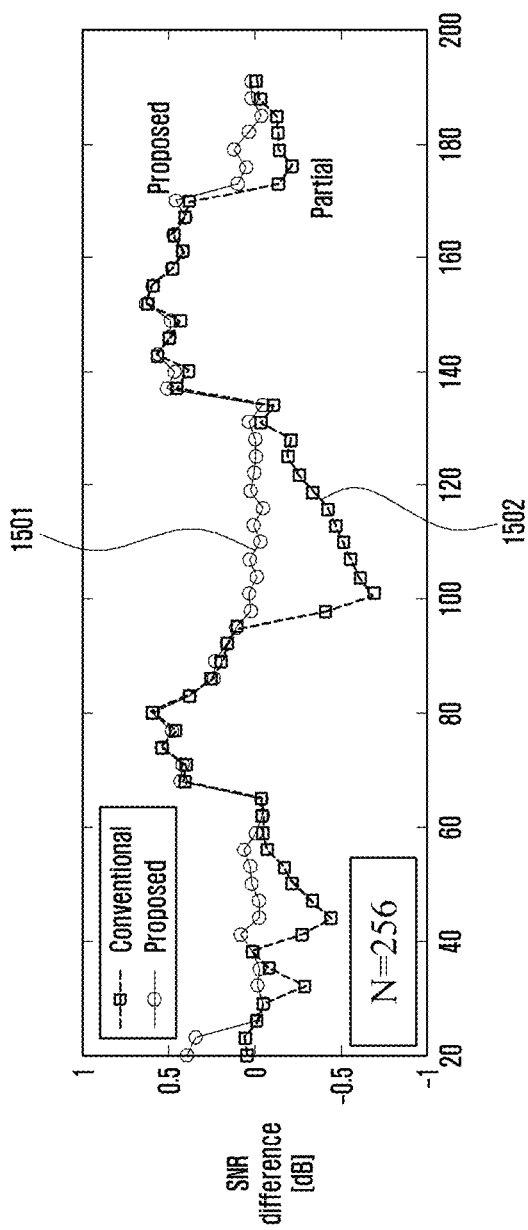
FIG. 15 is a simulation graph comparing performance between a scheme according to the disclosure and a scheme of conventional technique 1.

FIG. 15 is a simulation graph comparing performance between a scheme according to the disclosure and a scheme of conventional technique 1.

FIG. 15 is a graph obtained through a simulation of a 3-bit fine granularity performed at a code length of N=256. In addition, QPSK modulation and AWGN channel were assumed, and the graph plots performance gain [dB] compared to SNR that satisfies BLER=$10^{-4}$ of blind protection technique. Also, 11-bit CRC and SCL decoding with a list size of 8 were considered.

As in the case of FIG. 14, FIG. 15 shows similar or superior decoding performance compared to the conventional technique 1. Specifically, while taking advantages of the excellent decoding performance of the conventional techniques 1 and 2, it is possible to have better decoding performance in certain parameters.

Meanwhile, comparing the conventional techniques 1 and 2 in the above description, it can be seen that when the number of information bits increases, the conventional technique 2 exhibits a repeated pattern of performance superiority and inferiority compared to the conventional technique 1. This is because when the number of bits with the minimum weight in the set A is less than a certain threshold, the protection level is very low and the performance deteriorates. In addition, this is due to the effect that when it is equal to or greater than a certain threshold, bits included in the CRC protection area effectively reduce the number of codewords with MHW. On the other hand, in the case of the technique according to the disclosure, it has superior decoding performance compared to the conventional techniques 1 and 2 in overall code parameters, and may have better decoding performance even in areas (e.g., K=42) where the conventional technique 1 has superior performance than the conventional technique 2.

Figure 16A:
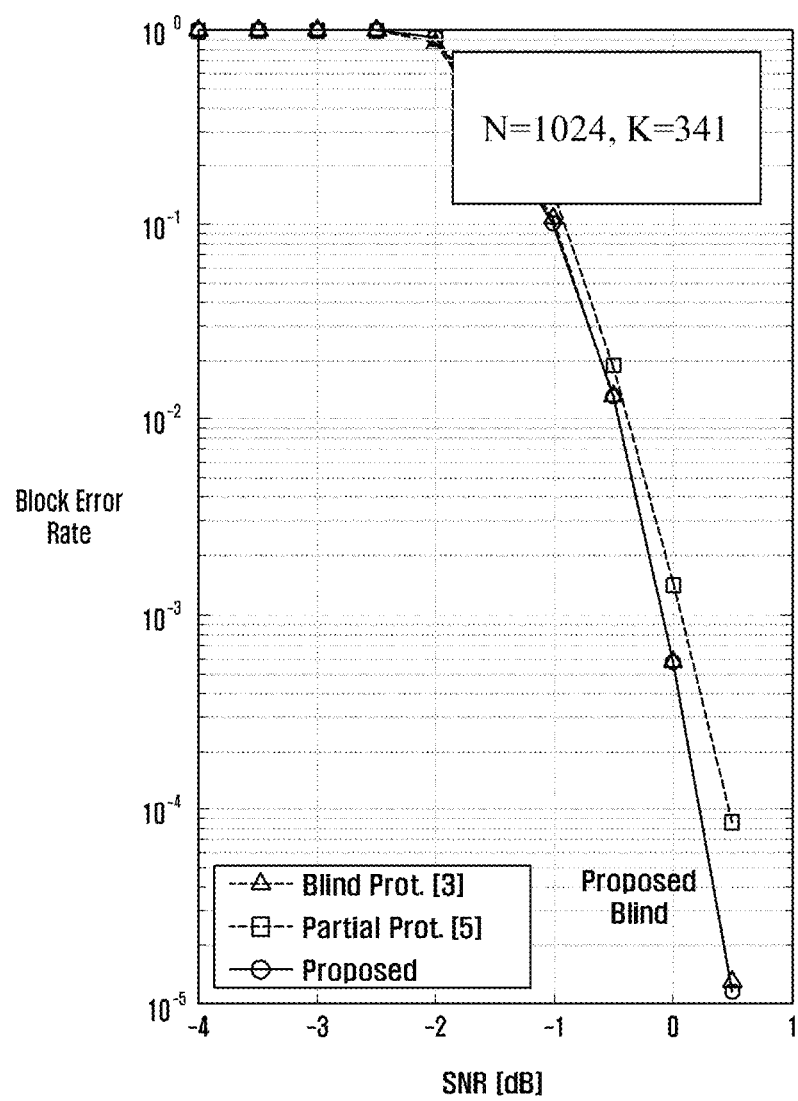
FIGS. 16A and 16B are simulation result graphs analyzing decoding performance according to SNR in conventional technique 1, conventional technique 2, and the disclosure.
Figure 16B:
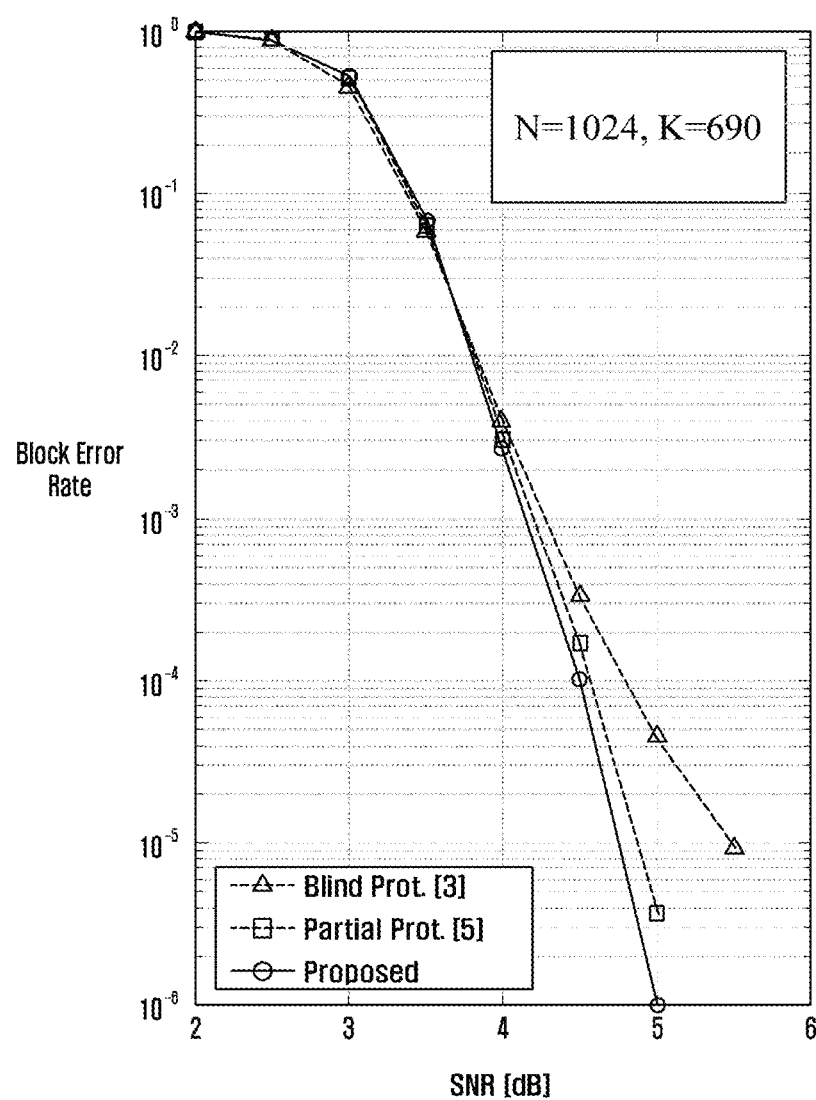

FIGS. 16A and 16B are simulation result graphs analyzing decoding performance according to SNR in conventional technique 1, conventional technique 2, and the disclosure.

Specifically, FIG. 16A shows BLER performance according to concatenation technique in the case of N=1024 and K=341 ($|A_m^1|$=2). In FIG. 16A, $|A_m^1|$=2, which is a smaller value than $\log_2 N$(=10) That is, the decoding performance of the conventional technique 2 (partial) is significantly lower than that of the conventional technique 1 (full), and as can be seen in the drawing, such a tendency appears. However, in the case of the technique according to the disclosure, the decoding performance can be maintained almost the same as that of the conventional technique 1.

Next, FIG. 16B is a graph showing BLER performance according to concatenation technique when N=1024 and K=690 ($|A_m^1|$=10). In FIG. 16B, $|A_m^1|$=10, which is greater than or equal to $\log_2 N$(=10) Therefore, the decoding performance of the conventional technique 2 (partial) is superior to that of the conventional technique 1 (full), and such a tendency appears in the graph illustrated in FIG. 16B. However, it can be seen that the decoding performance according to the disclosure ensures better decoding performance than that of the conventional technique 2.

Figure 17A:
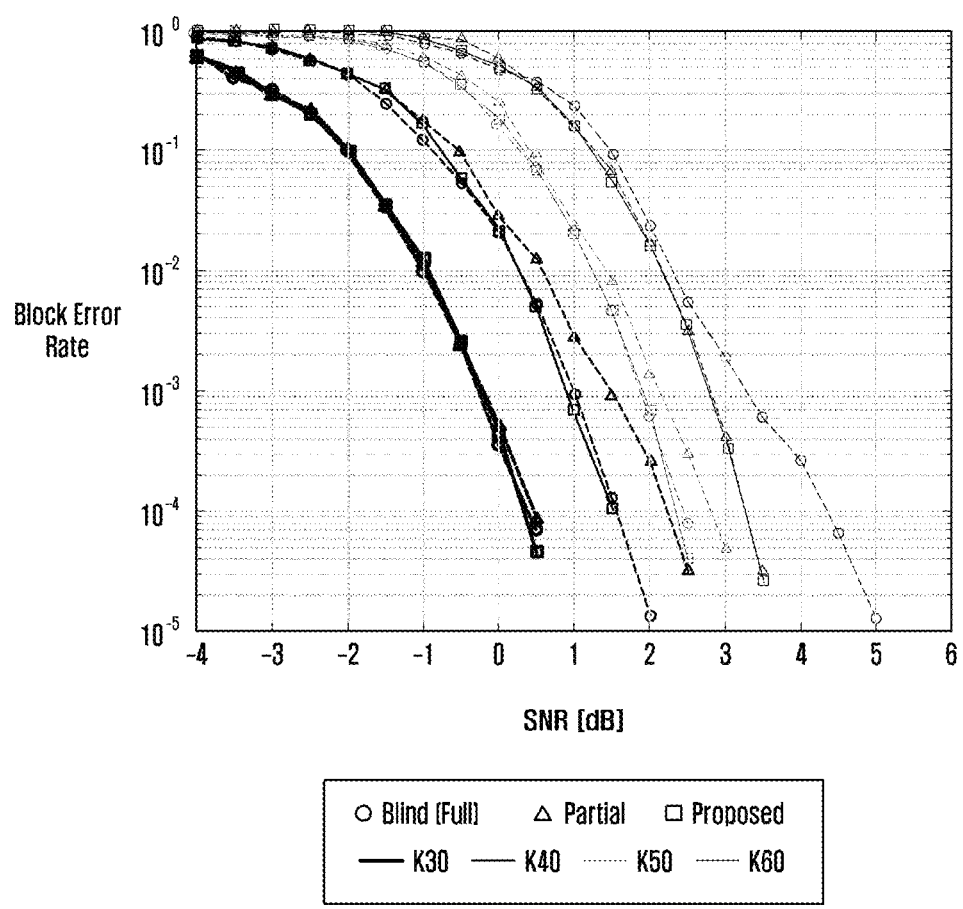
FIGS. 17A and 17B are simulation graphs comparing decoding performance according to changes in the value of K in the disclosure and conventional techniques.
Figure 17B:
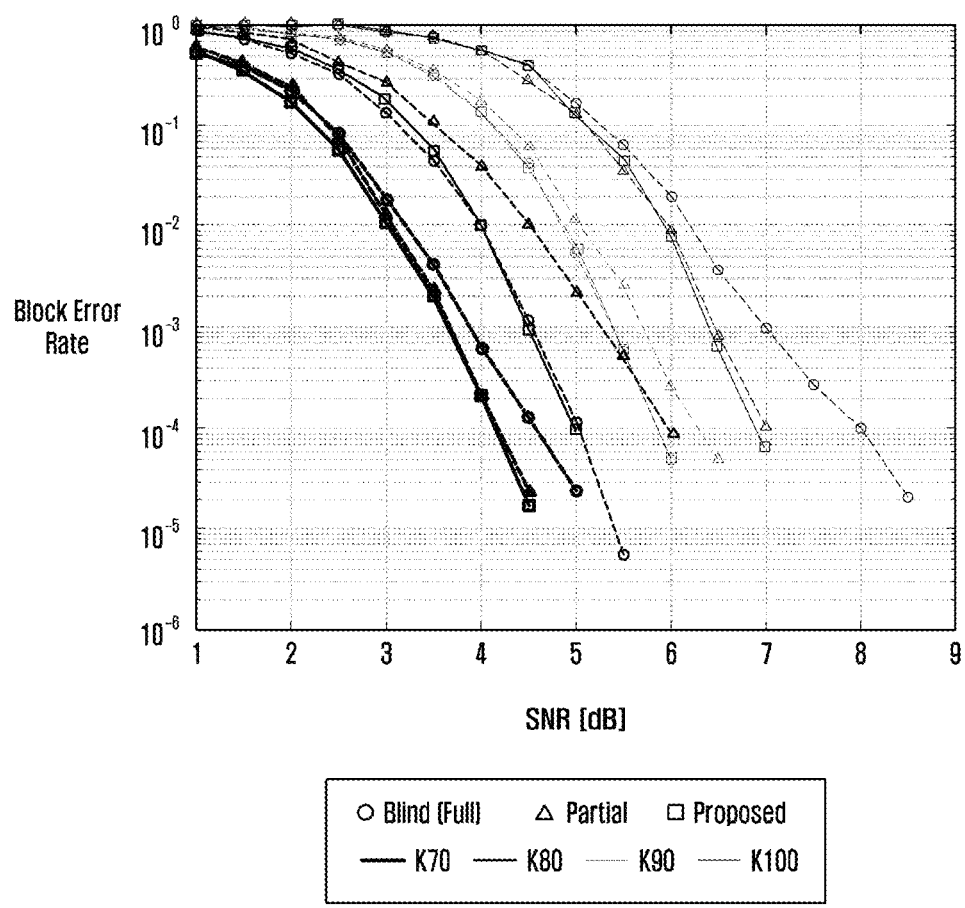
Figure 18A:
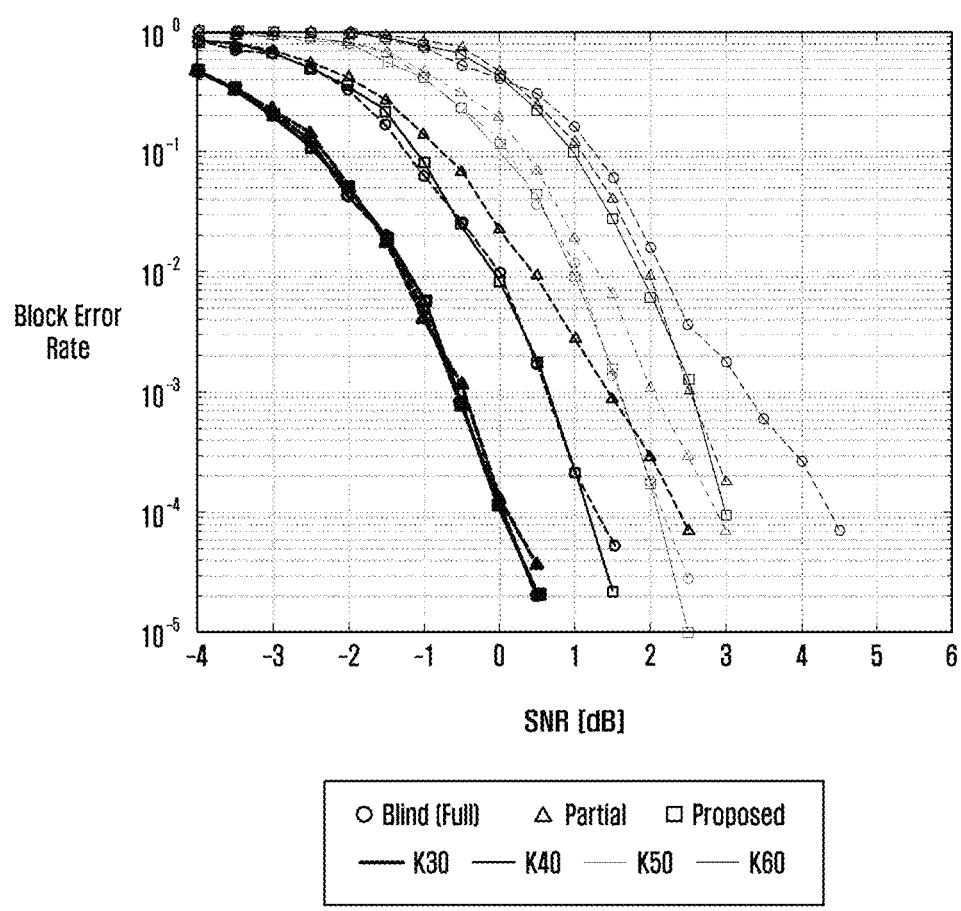
FIGS. 18A and 18B are simulation graphs comparing decoding performance according to changes in the value of K in the disclosure and conventional techniques.
Figure 18B:
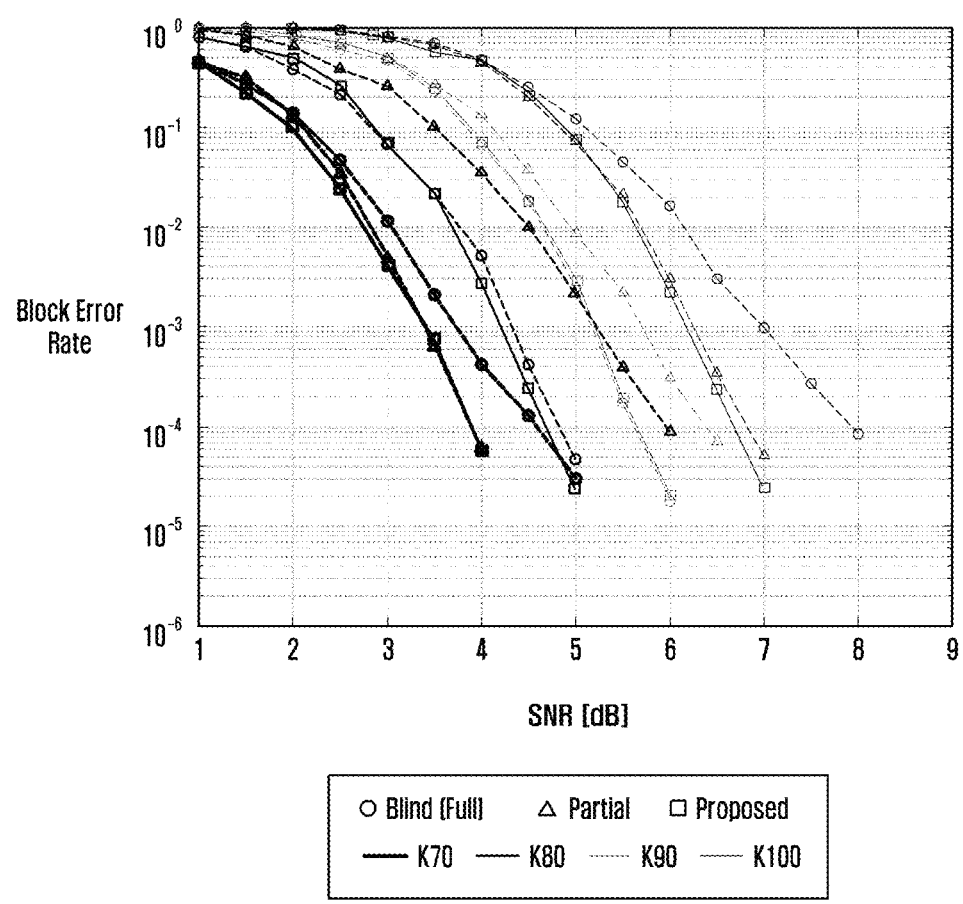

FIGS. 17A and 17B are simulation graphs comparing decoding performance according to changes in the value of K in the disclosure and conventional techniques, and FIGS. 18A and 18B are simulation graphs comparing decoding performance according to changes in the value of K in the disclosure and conventional techniques.

First, the graphs of FIGS. 17A and 17B show simulation results according to changes in the value of K in a state of fixing N=128 and L=32 in the conventional techniques 1 and 2 and the technique according to the disclosure.

As can be seen in FIGS. 17A and 17B, the two conventional techniques have a difference in superior and inferior decoding performance depending on changes in the K value (K=30, 40, 50, 60, 70, 80, 90, 100). However, it can be seen that the decoding performance according to the disclosure is similar to or better than that of the conventional techniques 1 and 2 even if the K value changes.

Next, the graphs of FIGS. 18A and 18B show simulation results according to changes in the K value in a state of fixing N=128 and L=128 in the conventional techniques 1 and 2 and the technique according to the disclosure.

As can be seen in FIGS. 18A and 18B, the two conventional techniques have a difference in superior and inferior decoding performance depending on changes in the K value (K=30, 40, 50, 60, 70, 80, 90, 100). However, it can be seen that the decoding performance according to the disclosure is similar to or better than that of the conventional techniques 1 and 2 even if the K value changes.

As can be seen from the simulation results of FIGS. 17A, 17B, 18A, and 18B, the technique according to the disclosure can support stable decoding performance compared to the conventional techniques even for various list sizes.

Next, technical fields to which the disclosure is applicable will be described.

The following embodiments will be described assuming a specific system, but it will be apparent to those skilled in the art that the disclosure is not limited to the system described below and can be applied to cases where encoding is required in various communication systems.

By applying the partial CRC protection method according to the disclosure, it is possible to secure similar or superior decoding performance (i.e., block error rate) in the overall code parameter area compared to the conventional techniques 1 and 2. This can be applied to next-generation communication systems such as beyond 5G and 6G as well as 5G currently standardized, and can support various scenarios by replacing or modifying the existing concatenated polar codes. In addition, when status information can be fed back between a transmitter and a receiver, a CRC protection index set (or CRC protection area, $A_{prot}$) suitable for code parameters can be determined and delivered to the transmitter, and based on this, the transmitter can perform efficient communication in a wireless communication system by using partial CRC concatenated polar codes according to the disclosure.

Figure 19:
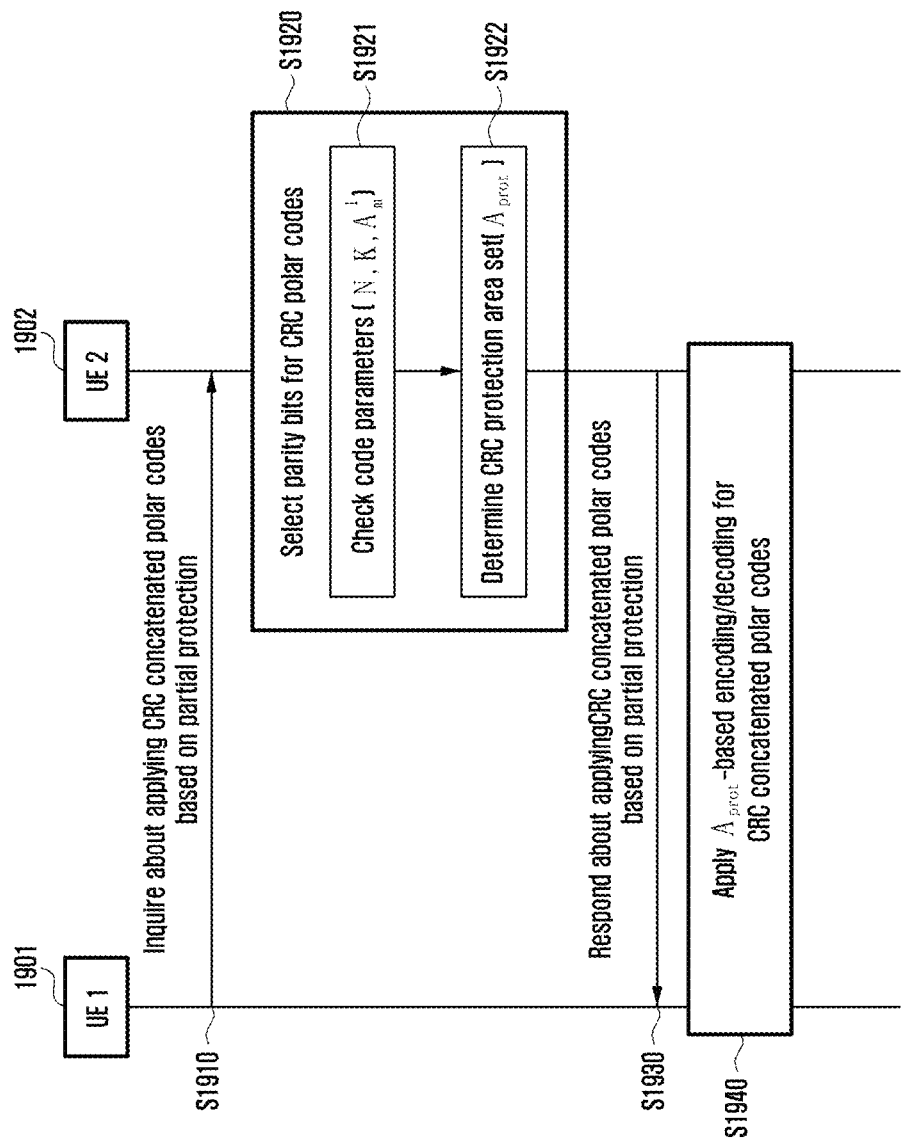
FIG. 19 is an exemplary diagram illustrating a scenario for communication between electronic devices in a wireless communication system according to an embodiment of the disclosure.

FIG. 19 is an exemplary diagram illustrating a scenario for communication between electronic devices in a wireless communication system according to an embodiment of the disclosure.

In FIG. 19, two UEs (user equipment) 1901 and 1902 are illustrated. This is, however, for convenience of explanation, and any two electronic devices capable of communicating with each other may be used. For example, the UE1 1901 may be a base station of a wireless communication system. In this case, the UE2 1902 may be a wireless communication device as an actual user device that communicates with the base station. Of course, the opposite case is also possible. That is, the UE1 1901 may be a wireless communication device as an actual user device that communicates with a base station, and in this case, the UE2 1902 may be the base station of a wireless communication system. In the case of uplink (UL), a transmitting end may be a UE and a receiving end may be a base station, and in the case of downlink (DL), a transmitting end may be a base station and a receiving end may be a UE.

In another example, both the UE1 1901 and the UE 1902 may be user devices. This case may be available in a device-to-device (D2D) scheme widely used in wireless communication systems and/or in any communication scheme that performs direct communication between electronic devices.

In yet another example, in the case of a WiFi system, the UE1 1901 may be an access point (AP), and the UE2 1902 may be any type of communication equipment that can access the AP. Of course, the opposite case is also possible. That is, the UE1 1901 may be any type of communication equipment that can access to an AP, and the UE2 1902 may be the AP.

There may be various other cases, and those skilled in the art will be able to easily recognize the expanded range of applicable wireless communication systems based on the above description.

Then, a procedure of performing communication between the UE1 1901 and the UE2 1902 by applying the disclosure will be described with reference to the drawings.

In FIG. 19, the UE1 1901 will be described as a transmitter and the UE2 1902 as a receiver. Additionally, it is assumed that the receiver UE2 1902 has information about a CRC protection bit index set (i.e., $A_{prot}$) based on the disclosure.

First, at step S1910, the UE1 1901 can inquire of the UE2 1902 about applying polar codes based on partial CRC protection. Then, at step S1920, the UE2 1902 can select parity bits for the CRC polar codes and, at step S1930, provide applying CRC concatenated polar codes based on partial protection to the UE1 1901 in response to the inquiry of the step S1910.

The step S1920 performed by the UE2 1902 includes step S1921 of checking code parameters according to a weight profile of bits in an information set A, and step S1922 of determining a CRC protection area set ($A_{prot}$) based on the checking result.

If both the UE1 1901 and the UE2 1902 can use the CRC concatenated polar code scheme according to the disclosure, data communication based on the index set for the CRC concatenated polar codes may be performed between the UE1 1901 and the UE2 1902 at step S1940. That is, the transmitter can encode and transmit information bits using the CRC code according to the disclosure, and the receiver can performs decoding using the CRC code according to the disclosure when decoding the received symbol.

Figure 20:
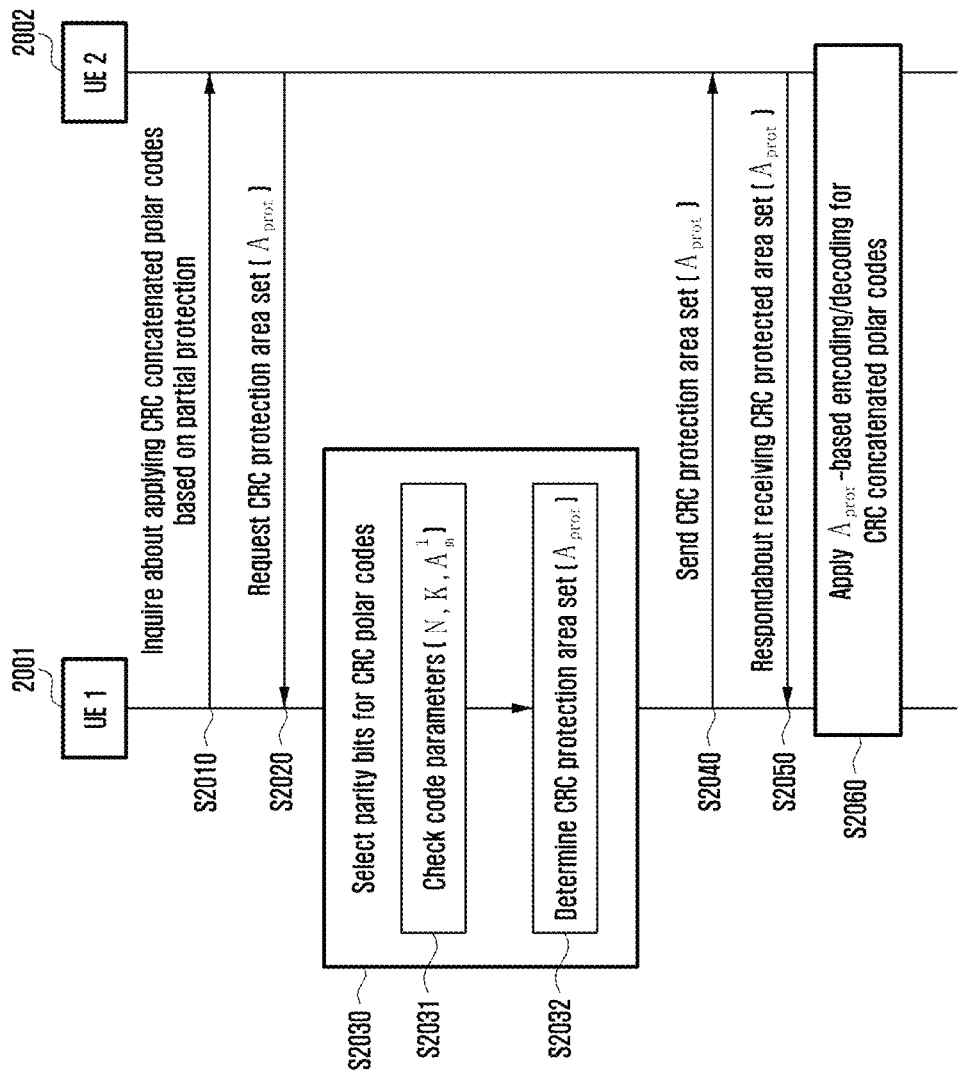
FIG. 20 is an exemplary diagram illustrating a scenario for communication between electronic devices in a wireless communication system according to another embodiment of the disclosure.

FIG. 20 is an exemplary diagram illustrating a scenario for communication between electronic devices in a wireless communication system according to another embodiment of the disclosure.

In FIG. 20, UEs 2001 and 2002 are illustrated as in FIG. 19. However, this is for convenience of explanation, and any two electronic devices capable of communicating with each other may be used. Since various forms of this assumption are mentioned in FIG. 19, redundant description will be omitted in FIG. 20.

FIG. 20 is a signal flowchart assuming that the receiver does not have a CRC protection area bit index set ($A_{prot}$) based on the disclosure.

With reference to FIG. 20, at step S2010, the UE1 2001 may inquire of the UE2 2002 about applying polar codes based on partial CRC protection according to the disclosure. It is assumed that the UE2 2002 has no information about code parameter $A_m^1$ and $A_{prot}$ according to the disclosure.

Therefore, the UE2 2002 may request a CRC protection area set ($A_{prot}$) in response to the inquiry of the step S2020. Then, the UE1 2001 can perform a CRC polar code parity bit selection operation at step S2030. Here, step S2030 may be the same operation as step S1920 described previously in FIG. 19. That is, the S2030 performed by the UE1 2001 includes step S2031 of checking code parameters according to a weight profile of bits in an information set A, and step S2032 of determining a CRC protection area set ($A_{prot}$) based on the checking result.

At step S2040, based on the above results, the UE1 2001 can transmit the CRC protection area set to the UE2 2002.

Then, the UE2 2002 can store the information received at the step S2040 and will use the CRC protection area set to decode the received data or encode data to be transmitted during data communication with the UE1 2001.

Additionally, at step S2050, the UE2 2002 may provide a response to receiving the CRC protection area set. This response can use the commonly used ACK/NACK. If the UE2 2002 provides NACK to the UE1 2001, the UE1 2001 can perform retransmission. This procedure will not be, however, elaborated.

Afterwards, at step S2060, the UE1 2001 and the UE2 2002 can transmit and receive data using the CRC concatenated polar codes. The transmitter can configure a CRC in the above-described method according to the disclosure and, using the configured CRC, generate a symbol to be transmitted through polar coding. Additionally, the receiver can lower the error rate of data by performing decoding based on the above-described method.

Figure 21:
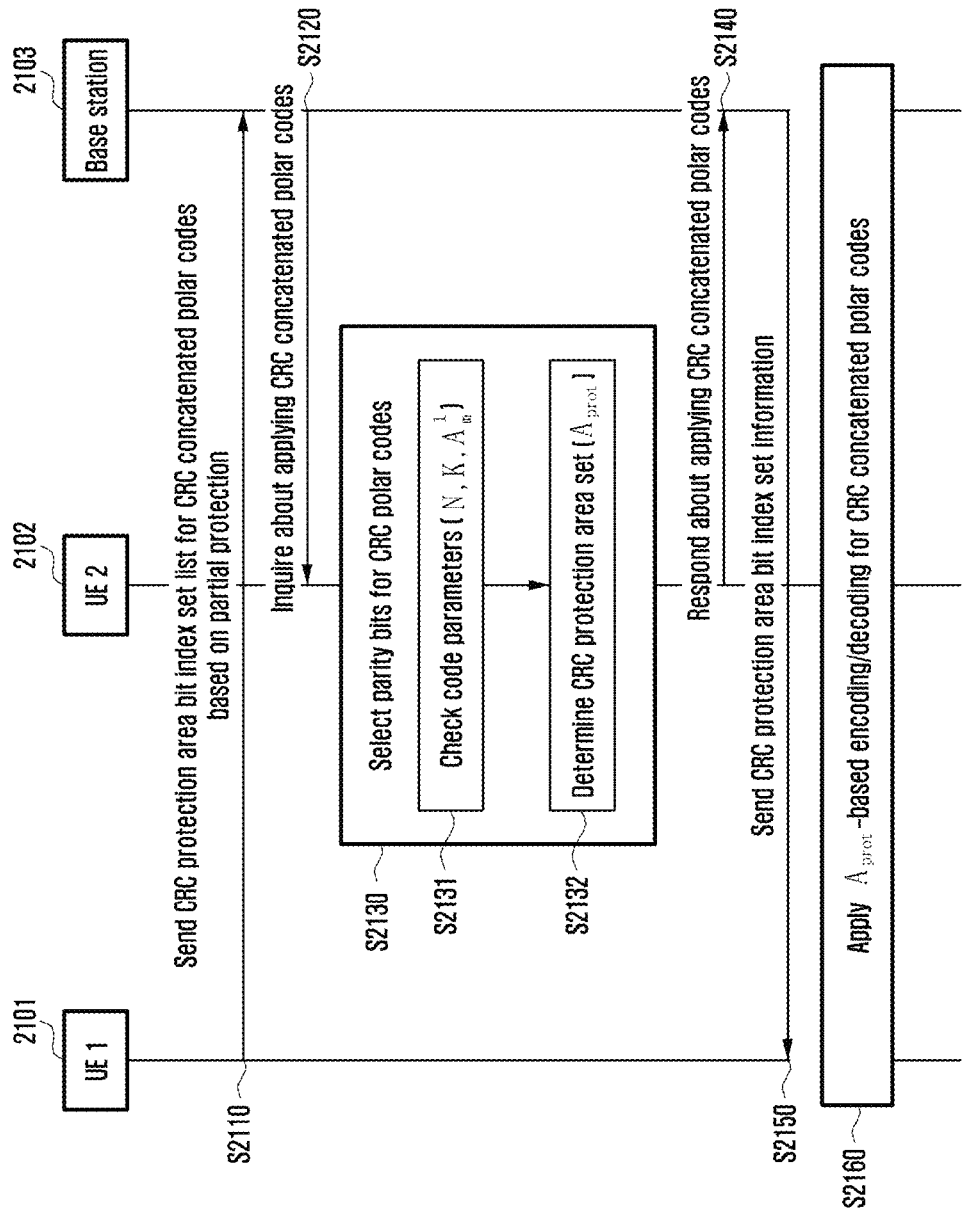
FIG. 21 is an exemplary diagram illustrating a scenario for communication between electronic devices in a wireless communication system according to yet another embodiment of the disclosure.

FIG. 21 is an exemplary diagram illustrating a scenario for communication between electronic devices in a wireless communication system according to yet another embodiment of the disclosure.

In FIG. 21, a base station 2103 is further included in addition to different UEs 2101 and 2102 described above. This example is merely one example, and the scheme of FIG. 21 can be used when communication between three different electronic devices is performed using the communication schemes described in FIG. 19 or other communication schemes.

With reference to FIG. 21, at step S2110, the UE1 2101 may transmit a CRC protection area bit index set list for CRC concatenated polar codes based on partial protection, which is the scheme according to the disclosure, to the base station 2103.

In this scenario, it is assumed that the base station 2103 is aware of the existence of the UE2 2102 which requires communication. Thus, at step S2120, the base station 2103 may inquire of the UE2 2102 about being able to apply the CRC concatenated polar codes based on partial protection.

The UE2 2102 may perform step S2130 based on the inquiry of the step S2120. Here, the step S2130 may be the same operation as the step S1920 and the step S2030 described above in FIGS. 19 and 20, respectively.

That is, the S2130 performed by the UE2 2102 may include step S2131 of checking code parameters according to a weight profile of bits in an information set A, and step S2132 of determining a CRC protection area set ($A_{prot}$) based on the checking result. After selecting the parity bit for the CRC polar codes, the UE2 2102 may transmit a response message about applying CRC concatenated polar codes to the base station 2103 at step S2140.

Then, the base station 2103 can store information based on the response message received at the step S2140 and transmit it to the UE1 2101 at step S2150. That is, the CRC protection bit index set information provided by the UE2 2102 to the base station 2103 can be delivered. Then, the UE1 2101 can store the information received from the base station 2103 for use by the UE2 2102.

Thereafter, communication can be performed among the UE1 2101, the UE2 2102, and the base station 2103 using the parity bit for the CRC polar codes in the same manner. Based on these results, as described above, the data error rate can be reduced in the disclosure compared to the conventional techniques.

Figure 22:
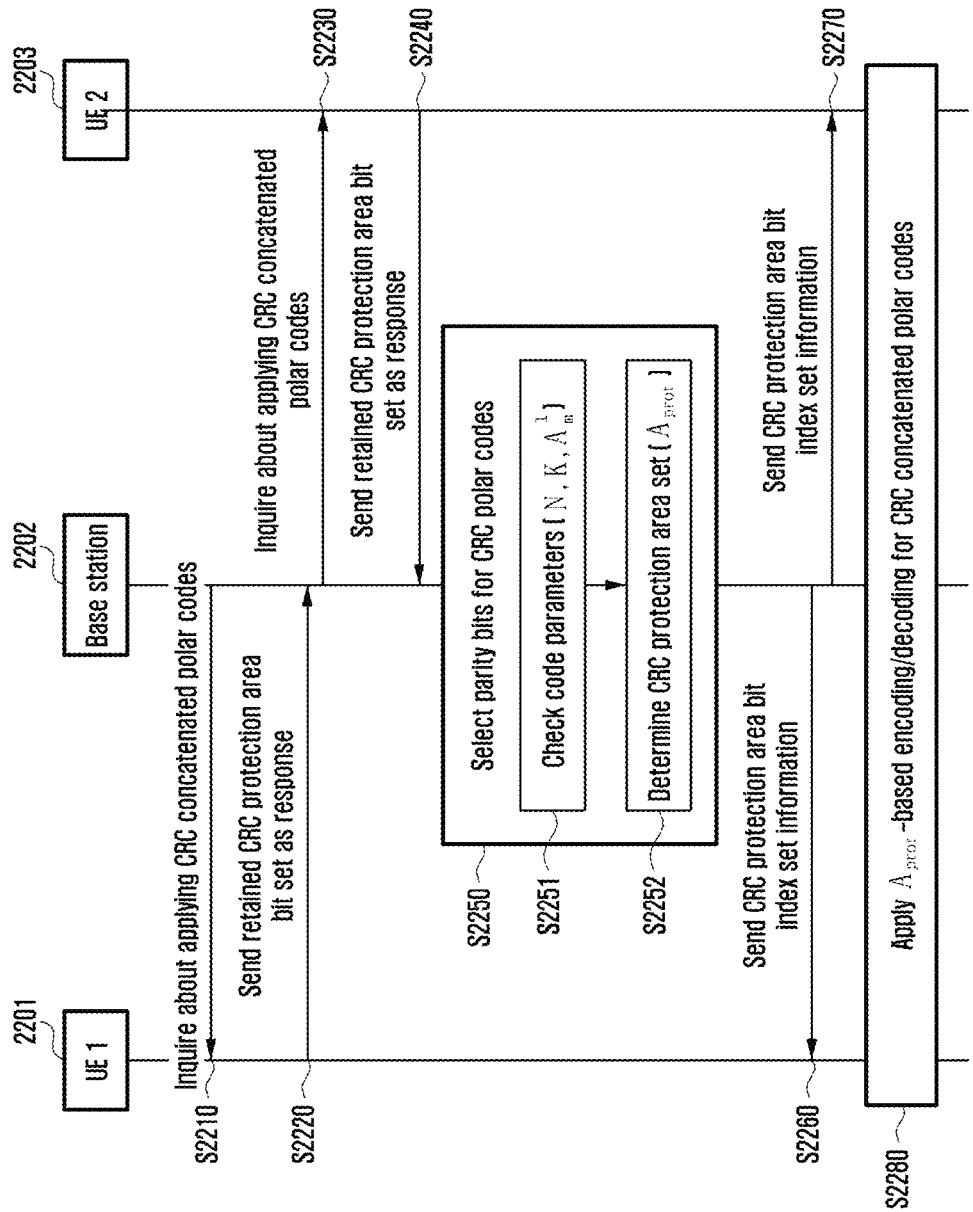
FIG. 22 is an exemplary diagram illustrating a scenario for communication between electronic devices in a wireless communication system according to still another embodiment of the disclosure.

FIG. 22 is an exemplary diagram illustrating a scenario for communication between electronic devices in a wireless communication system according to still another embodiment of the disclosure.

In FIG. 22, different UEs 2101 and 2102 and a base station 2103 are included as in FIG. 21 described above. This example is merely one example, and the scheme of FIG. 22 can be used when communication between three different electronic devices is performed using the communication schemes described in FIG. 19 or other communication schemes.

With reference to FIG. 22, at step S2210, the base station 2202 may inquire of the UE1 2201 about applying CRC polar codes. Then, at step S2220, the UE1 2201 can transmit a retained CRC protection area bit set to the base station 2022 in response to the inquiry of the S2210. In this scenario, the UE1 2201 may be in a state of previously storing information about the CRC protection area bit set. If not, the step S1920 described above in FIG. 19 and/or the step S2030 described in FIG. 20 and/or the step S2130 described in FIG. 21 may be performed, and the result may be provided.

Afterwards, at step S2230, the base station 2202 may inquire of the UE2 2203 about applying the CRC polar codes. Then, at step S2240, the UE2 2203 can transmit the retained CRC protection area bit set to the base station 2022 in response to the inquiry of the step S2230. The UE2 2201 as well may be in a state of previously storing information about the CRC protection area bit set. If not, the step S1920 described above in FIG. 19 and/or the step S2030 described in FIG. 20 and/or the step S2130 described in FIG. 21 may be performed, and the result may be provided.

The base station 2202 receives all the retained CRC protection area bit sets from the UEs 2201 and 2203 that need to communicate with itself and/or communicate with each other, and selects parity bits for the CRC polar codes at step S2250.

Specifically, the base station 2202 may determine at step S2251 a CRC protection bit index set that it can use, based on common code parameters (i.e., N, K, $A_m^1$) among the code parameters received from the UE1 2201 and the UE2 2203, and based on this, determine a CRC protection area set ($A_{prot}$).

If the base station 2202 communicates with the UE1 2201 and the UE2 2203, but the UE1 2201 does not directly communicate with the UE2 2203, the step S2250 may be performed for each UE. For example, the base station 2202 may determine at first step S2251 a CRC protection bit index set that it can use, based on common code parameters (i.e., N, K, $A_m^1$) among the code parameters received from the UE1 2201, and based on this, determine a CRC protection area set ($A_{prot}$) at first step S2252. In addition, the base station 2202 may determine at second step S2251 a CRC protection bit index set that it can use, based on common code parameters (i.e., N, K, $A_m^1$) among the code parameters received from the UE2 2203, and based on this, determine a CRC protection area set ($A_{prot}$) at second step S2252.

Hereinafter, the subsequent operations will be described using only the state implemented in FIG. 22 for convenience of explanation, At step S2260, the base station 2202 may transmit the CRC protection bit index set information to the UE1 2201. Additionally, at step S2270, the base station may transmit the same CRC protection bit index set information to the UE2 2203 as that transmitted to the UE1 2201. FIG. 22 shows that information is transmitted first to the UE1 2201 and later to the UE2 2203. However, if message reception is not degraded due to signal transmission collision when the same information is transmitted simultaneously, information transmission may be performed simultaneously. In another example, information may be transmitted first to the UE2 2203 and later to the UE1 2201.

Through the above operations, the UE1 2201, the UE2 2203, and the base station 2202 can equally share the CRC protection area bit index set information according to the disclosure. Therefore, at step S2280, data communication based on the CRC concatenated polar codes according to the disclosure can be performed among the UE1 2201, the UE2 2203, and the base station 2202.

Based on these results, as described above, the data error rate can be reduced in the disclosure compared to the conventional techniques.

Figure 23:
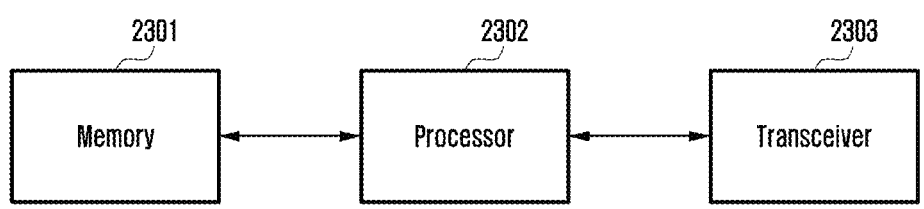
FIG. 23 is a block diagram of an electronic device according to the disclosure.

FIG. 23 is a block diagram of an electronic device according to the disclosure.

FIG. 23 shows an internal block configuration of an electronic device to which the disclosure can be applied, and may include a memory 2301, a processor 2302, and a transceiver 2303.

The memory 2301 may store CRC protection area bit index set information according to the disclosure, a program for performing the above-described communication scheme between the UEs, and/or a program for performing the above-described communication scheme between the UE and the base station. Additionally, the memory 2301 may further store any other information. The memory 2301 may include volatile memory or non-volatile memory.

The processor 2302 may include one or two processors. For example, if a communication processor (CP) and an application processor (AP) are separated, the processor may include two processors. Alternatively, if the CP and the AP are implemented as one chip, the processor may be implemented as one processor. In another example, the processor may further include any processor other than the CP and the AP. As such, the processor 2302 may include one or more processors.

Additionally, one processor may include one or more cores. Such cores may be provided to distribute and process operations in the processor. The purpose of having multiple cores for distributed processing is to improve a processing speed.

If the processor 2302 includes a CP function, it can perform the above-described operation of determining the CRC protection area and the polar coding operation according to the disclosure. On the other hand, if the processor 2302 does not include the CP function, the operation of the CP may be included in the transceiver 2303 described below.

The transceiver 2303 may or may not include the communications processor (CP). If the transceiver 2303 includes the CP, it can perform the above-described operation of determining the CRC protection area and the polar coding operation according to the disclosure. Additionally, the transceiver 2303 may have components for transmitting signals. For example, when wireless communication is used, an antenna, a wireless circuit for transmitting signals, etc. may be further included.

In addition, the encoder 110 in FIG. 1A, and the CRC adder 211 and the polar encoder 212 of the transmitter described in FIG. 2 may be included in the processor 2302 or the transceiver 2303. Also, the SCL decoder 231 and the CRC detector 232 of the receiver may be included in the processor 2302 or the transceiver 2303.

Meanwhile, the electronic device illustrated in FIG. 23 may be the transmitter and/or the receiver described above. It may also be the UE1, the UE2, and/or the base station described in FIGS. 19 to 22. Since FIG. 23 only illustrates components necessary for the disclosure, it will be apparent to those skilled in the art that additional components may be added.

For example, if the electronic device is a UE, it may include various interfaces for the user to input information or commands. Among various interfaces, an input interface may include a touch screen, a stylus pen, a key or button input unit, etc. Additionally, it may include an output interface for outputting information to the user, such as a display, a speaker, a vibration motor, etc. Additionally, when providing portability or mobility to the user, it may further include a power device such as a battery. In addition, various sensors, cameras, etc. may be included for convenience.

In addition, if the configuration of FIG. 23 is a base station, it may further include an interface for communicating with a higher level network and/or an interface for communicating with another base station and/or a device for interfacing with a system operator.

Although specific embodiments have been described in the detailed description of the disclosure, various modifications are possible without departing from the scope of the disclosure. Therefore, the scope of the disclosure should not be limited to the described embodiments and should be defined by claims set forth below as well as equivalents to claims.

Industrial Applicability

The disclosure can be applied when polar codes are used in a wireless communication system.

The invention claimed is:

1. An encoding method using polar codes in a communication system, the encoding method comprising:
identifying K+1 bit indexes including K information bit indexes to be transmitted and 1 cyclic redundancy check (CRC) bit indexes;
identifying weak bit indexes among the K+1 bit indexes based on row weights corresponding to the K+1 bit indexes and polarization reliabilities corresponding to the K+1 bit indexes, wherein in case that a minimum row weight is less than a first threshold, the identified weak bit indexes include at least one weak bit index corresponding to the minimum row weight, at least one weak bit index corresponding to a next minimum row weight, and at least one weak bit index corresponding to a polarization reliability equal to or less than a second threshold;
generating 1 CRC bits for weak bits corresponding to the identified weak bit indexes, wherein the 1 CRC bits correspond to the 1 CRC bit indexes;
generating bits including K information bits and the 1 CRC bits that are concatenated, wherein the K information bits correspond to the K information bit indexes; and
performing polar-encoding on the generated bits.

2. The encoding method of claim 1, wherein generating the bits comprises:
generating 1' CRC bits for the K information bits; and
generating the bits including the K information bits, the 1' CRC bits and the 1 CRC bits.

3. The encoding method of claim 1, wherein the first threshold is $\log_2 N$, wherein N is a number of generated bits.

4. The encoding method of claim 1, wherein in case that the minimum row weight is equal to or higher than the first threshold, the identified weak bit indexes include the at least one weak bit index corresponding to the minimum row weight and the at least one weak bit index corresponding to the polarization reliability equal to or less than the second threshold.

5. The encoding method of claim 1, further comprising:
transmitting information on the weak bit indexes in response to reception of an inquiry about a protection area associated with the 1 CRC bits.

6. An encoding apparatus comprising:
a memory;
a transceiver; and
a processor coupled with the memory and the transceiver, wherein the processor is configured to:
identify K+1 bit indexes including K information bit indexes to be transmitted and 1 cyclic redundancy check (CRC) bit indexes,
identify weak bit indexes among the K+1 bit indexes based on row weights corresponding to the K+1 bit indexes and polarization reliabilities corresponding to the K+1 bit indexes, wherein in case that a minimum row weight is less than a first threshold, the identified weak bit indexes include at least one weak bit index corresponding to the minimum row weight, at least one weak bit index corresponding to a next minimum row weight, and at least one weak bit index corresponding to a polarization reliability equal to or less than a second threshold,
generate 1 CRC bits for weak bits corresponding to the identified weak bit indexes, wherein the 1 CRC bits correspond to the 1 CRC bit indexes,
generate bits including K information bits and the 1 CRC bits that are concatenated, wherein the K information bits correspond to the K information bit indexes, and
perform polar-encoding on the generated bits.

7. The encoding apparatus of claim 6, wherein the processor is further configured to:
generate 1' CRC bits for the K information bits, and
generate the bits including the K information bits, the 1' CRC bits and the 1 CRC bits.

8. The encoding apparatus of claim 6, wherein the first threshold is $\log_2 N$, wherein N is a number of generated bits.

9. The encoding apparatus of claim 8, wherein in case that the minimum row weight is equal to or higher than the first threshold, the identified weak bit indexes include the at least one weak bit index corresponding to the minimum row weight and the at least one weak bit index corresponding to the polarization reliability equal to or less than the second threshold.

10. The encoding apparatus of claim 8, wherein the processor is further configured to transmit information on the weak bit indexes in response to reception of an inquiry about a protection area associated with the I CRC bits.

* * * * *